(12) United States Patent
Mukae

(10) Patent No.: US 7,642,696 B2
(45) Date of Patent: Jan. 5, 2010

(54) VIBRATION ACTUATOR AND DRIVE UNIT INCLUDING THE SAME

(75) Inventor: Hideaki Mukae, Hyogo (JP)

(73) Assignee: Panasonic Corporation, Kadoma (JP)

( * ) Notice: Subject to any disclaimer, the term of this patent is extended or adjusted under 35 U.S.C. 154(b) by 22 days.

(21) Appl. No.: 12/169,065

(22) Filed: Jul. 8, 2008

(65) Prior Publication Data

US 2009/0015099 A1    Jan. 15, 2009

(30) Foreign Application Priority Data

Jul. 11, 2007    (JP) ............................. 2007-182605

(51) Int. Cl.
*H01L 41/08*    (2006.01)
(52) U.S. Cl. ................................. 310/323.01
(58) Field of Classification Search ................................
310/323.01–323.21, 328, 330; *H01L 41/08*
See application file for complete search history.

(56) References Cited

U.S. PATENT DOCUMENTS 6,897,598 B2 *  5/2005  Kato et al. ............. 310/323.02
7,545,085 B2 *  6/2009  Adachi ........................ 310/365

FOREIGN PATENT DOCUMENTS

| JP | 62-201075 | 9/1987 |
|---|---|---|
| JP | 07-241743 | 9/1995 |
| JP | 2004-254390 | 9/2004 |
| JP | 2005-094956 | 4/2005 |
| JP | 2007-306800 | 11/2007 |
| JP | 2007-318997 | 12/2007 |

\* cited by examiner

*Primary Examiner*—Walter Benson
*Assistant Examiner*—Karen B Addison
(74) *Attorney, Agent, or Firm*—Renner, Otto, Boisselle & Sklar, LLP

(57) ABSTRACT

An ultrasonic actuator includes an actuator body, a case and a support rubber. The support rubber is made of conductive rubber having alternately stacked insulating layers and conductive layers and arranged between the case and the actuator body such that an external electrode and an electrode is brought into conduction and applies in advance a compressive force in the direction of longitudinal vibration to the actuator body at a non-node part of the vibration of the actuator body. The support rubber is arranged such that the stacking direction of the conductive rubber intersects with a plane including the direction of longitudinal vibration and the direction of bending vibration of the actuator body.

10 Claims, 15 Drawing Sheets even if electric power applied to the vibration actuator is raised to provide an appropriate driving force. Thus, the elastic deformation of the piezoelectric element is prevented from exceeding the elastic limit and the piezoelectric element is prevented from breaking.

VIBRATION ACTUATOR AND DRIVE UNIT INCLUDING THE SAME

BACKGROUND OF THE INVENTION

1. Field of the Invention

The present invention relates to a vibration actuator having a piezoelectric element and a drive unit including the vibration actuator.

2. Description of Related Art

A vibration actuator including a piezoelectric element has been known. For example, Japanese Unexamined Patent Publication No. 2005-94956 discloses a vibration actuator.

The vibration actuator according to Japanese Unexamined Patent Publication No. 2005-94956 includes an actuator body including a piezoelectric element and driver elements attached to the actuator body.

The actuator body includes a plate-like piezoelectric element having a lengthwise direction. When AC voltages whose phases are different from each other are applied to two pairs of electrodes aligned along diagonal lines of the piezoelectric element, the actuator body generates longitudinal vibration in the lengthwise direction of the piezoelectric element (so-called stretching vibration) and bending vibration in the widthwise direction of the piezoelectric element (so-called transverse vibration) in harmony. As a result, driver elements make a circular motion, i.e., an elliptical motion, on a plane including the lengthwise and widthwise directions of the piezoelectric element.

The thus-configured vibration actuator is provided between a stationary body and a movable body arranged to be movable relative to the stationary body. To be more specific, the vibration actuator is fixed to one of the stationary body and the movable body, while the driver elements are in touch with the other one of the stationary body and the movable body (hereinafter referred to as a touched body). In this state, the vibration actuator is operated such that the driver elements make the circular motion as described above. Then, the driver elements press the touched body with increased friction during a certain part of the circular motion, while they come out of contact with the touched body or reduce the friction on the touched body during another part of the circular motion. When the driver elements press the touched body during the circular motion, a driving force is transmitted to the movable body through the friction between the driver elements and the touched body. Thus, the movable body is moved in a predetermined direction.

The vibration actuator disclosed by Japanese Unexamined Patent Publication No. 2005-94956 achieves size reduction by baking the driver elements and the piezoelectric element in one piece.

SUMMARY OF THE INVENTION

If a vibration actuator is downsized in the manner described in Japanese Unexamined Patent Publication No. 2005-94956, the electric power applied to the vibration actuator tends to be raised in order to ensure appropriate driving force. As a result of raising the power applied to the vibration actuator, strain exerted on the piezoelectric element increases. When the strain exceeds the elastic limit of the piezoelectric element, the piezoelectric element may break.

With the foregoing in mind, the present invention has been achieved. An object of the invention is to prevent the piezoelectric element from deforming over the elastic limit such that the piezoelectric element is not broken.

A vibration actuator of the present invention includes: an actuator body having a piezoelectric element and an on-actuator body feeding electrode for applying a voltage to the piezoelectric element, the actuator body delivering a driving force by generating a plurality of vibrations in different directions; a base containing the actuator body and having an on-base feeding electrode for feeding the actuator body; and a pressurizing element made of conductive rubber including stacked insulators and conductors and arranged between the base and the actuator body such that the pressurizing element brings the on-actuator body feeding electrode and the on-base feeding electrode into conduction and applies in advance a compressive force in the direction of at least one of the vibrations to the actuator body at a non-node part of the at least one of the vibrations of the actuator body. The pressurizing element is arranged such that the stacking direction of the conductive rubber intersects with a plane including the directions of the plurality of vibrations of the actuator body.

According to the above-described configuration, the pressurizing element applies the compressive force in advance to the actuator body at the non-node part of the actuator body. Therefore, tensile stress which occurs in the piezoelectric element when the vibration actuator is operated is reduced. Thus, the piezoelectric element is less likely to break.

Since the pressurizing element is made of the conductive rubber and the on-actuator body feeding electrode of the actuator body and the on-base feeding electrode of the base are brought into conduction by the pressurizing element, the electrical conduction between the actuator body and the base is achieved without hindering the vibrations of the actuator body and there is no need of connecting feeding wires to the actuator body by soldering or the like. As a result, the break of the actuator body due to stress concentration on the soldered parts is prevented.

In the vibration actuator configured such that the pressurizing element interposed between the base and the actuator body applies the compressive force to the actuator body, the pressurizing element is deformed as the actuator body vibrates. When the pressurizing element is made of conductive rubber including stacked insulators and conductors such that the pressurizing element brings the on-actuator body feeding electrode of the actuator body and the on-base feeding electrode of the base into conduction, conduction failure may occur between the pressurizing element and the actuator body or between the pressurizing element and the base, if the arrangement of the pressurizing element is inappropriate.

From this aspect, according to the present invention, the conductive rubber prepared by stacking insulating rubbers and conductors is arranged such that the stacking direction of the rubbers and the conductors intersects with a plane including the directions of the plurality of vibrations of the actuator body. With this configuration, even if the conductive rubber of the stacked structure is deformed as the actuator body vibrates, good conduction is ensured between the pressurizing element and the actuator body and between the pressurizing element and the base. Thus, the electrical conduction between the actuator body and the base through the pressurizing element is maintained.

A drive unit of the present invention includes: the above-described vibration actuator; a relative movable body which is movable relative to the vibration actuator; and a biasing element which biases the vibration actuator toward the relative movable body.

According to the present invention, the pressurizing element applies the compressive force in advance to the actuator body at the non-node part of the actuator body. Therefore, the vibration actuator is provided with the piezoelectric element which is less likely to break. Additionally, since the pressurizing element is made of conductive rubber including stacked insulating rubbers and conductors and the pressurizing element is arranged to bring the on-actuator body feeding electrode and the on-base feeding electrode into conduction, there is no need of connecting feeding wires to the actuator body by soldering or the like. Therefore, the break of the actuator body due to stress concentration on the soldered parts is prevented. Further, the pressurizing element is arranged such that the stacking direction of the conductive rubber intersects with the plane including the directions of the plurality of vibrations of the actuator body. Therefore, even if the pressurizing element is deformed as the actuator body vibrates, the electrical conduction between the actuator body and the base is maintained.

BRIEF DESCRIPTION OF THE DRAWINGS

FIG. 11A shows the stage not driven yet, FIG. 11B shows the stage driven by one of driver elements as the actuator body stretches in the lengthwise direction and FIG. 11C shows the stage driven by the other driver element as the actuator body contracts in the lengthwise direction.

DETAILED DESCRIPTION OF THE INVENTION

Hereinafter, embodiments of the present invention will be described with reference to the drawings.

Embodiment 1

Figure 3:
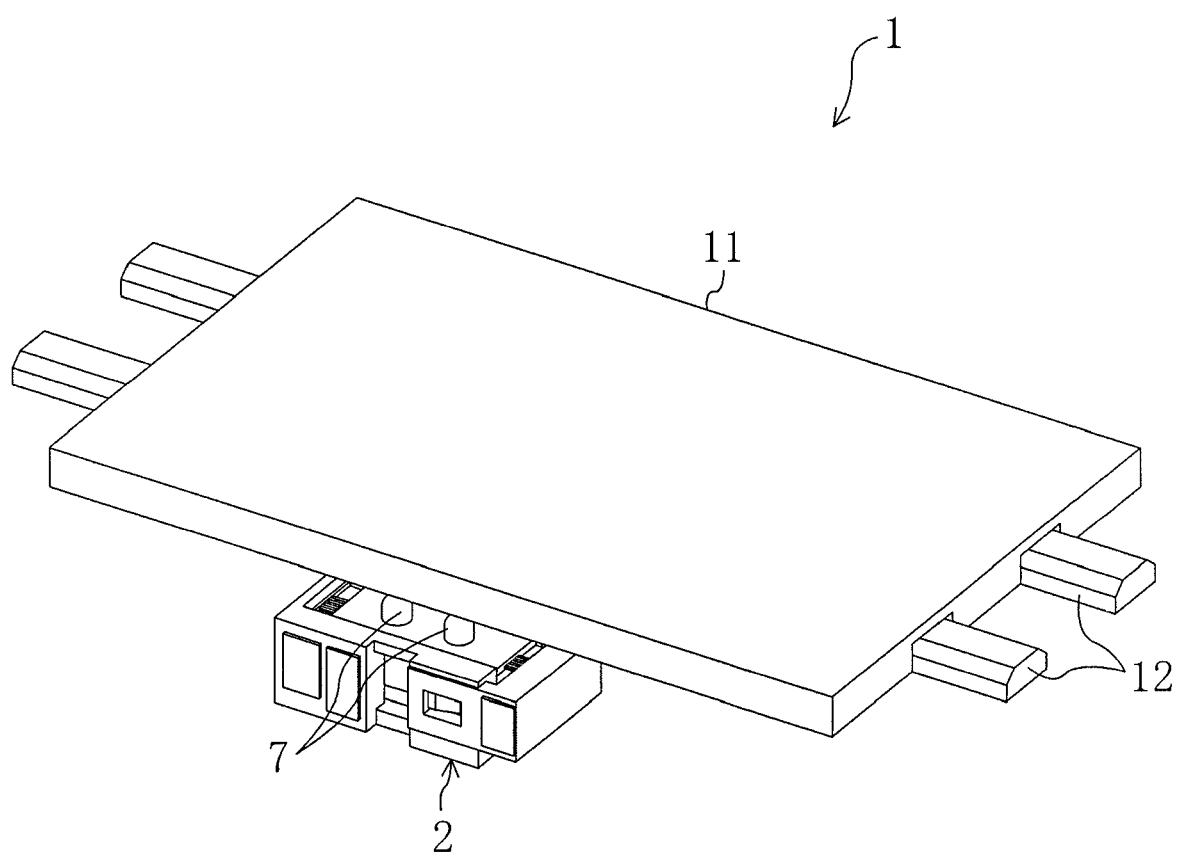
FIG. 3 is a perspective view of a drive unit.

A drive unit 1 according to Embodiment 1 of the invention includes, as shown in FIG. 3, a stage 11, an ultrasonic actuator 2 and a control unit (not shown) for controlling and driving the ultrasonic actuator 2.

The stage 11 is slidably attached to guides 12 fixed in parallel with each other to a base (not shown) as a stationary body. That is, the stage 11 is movable in the extending direction of the guides 12. The extending direction of the guides 12 is the moving direction of the stage 11. The stage 11 is a plate-like member and substantially square-shaped when viewed in plan. The stage 11 is made of alumina, but the material of the stage 11 is not limited to alumina and any other material may optionally be used. The ultrasonic actuator 2 is arranged such that driver elements 7 described later come into contact with the rear surface of the stage 11 (the surface on which the guides 12 are provided). The stage 11 functions as a relative movable body which is able to move relative to the ultrasonic actuator 2 when it receives a driving force generated by the ultrasonic actuator 2.

Figure 1:
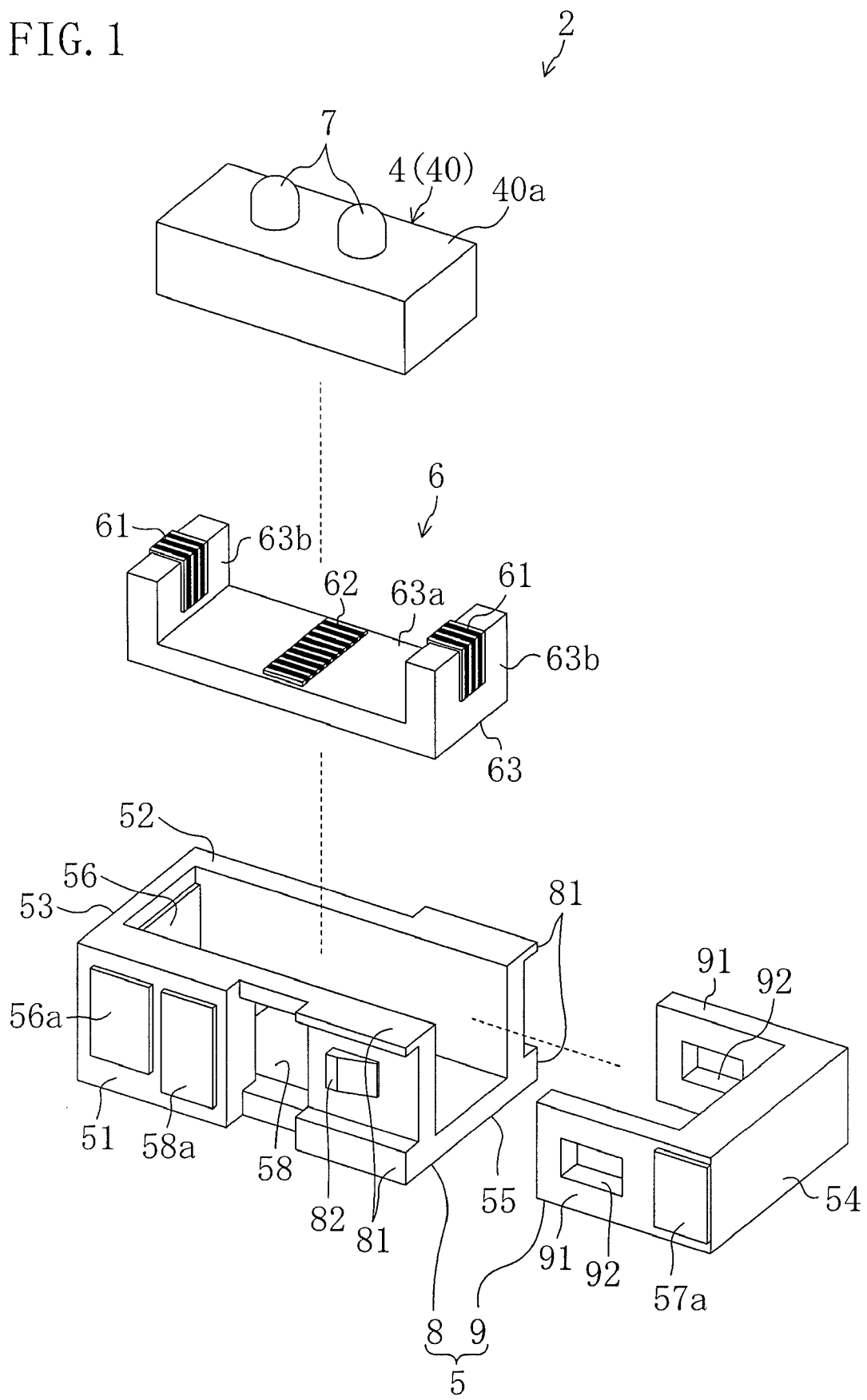
FIG. 1 is an exploded perspective view of an ultrasonic actuator according to Embodiment 1 of the present invention.
Figure 2:
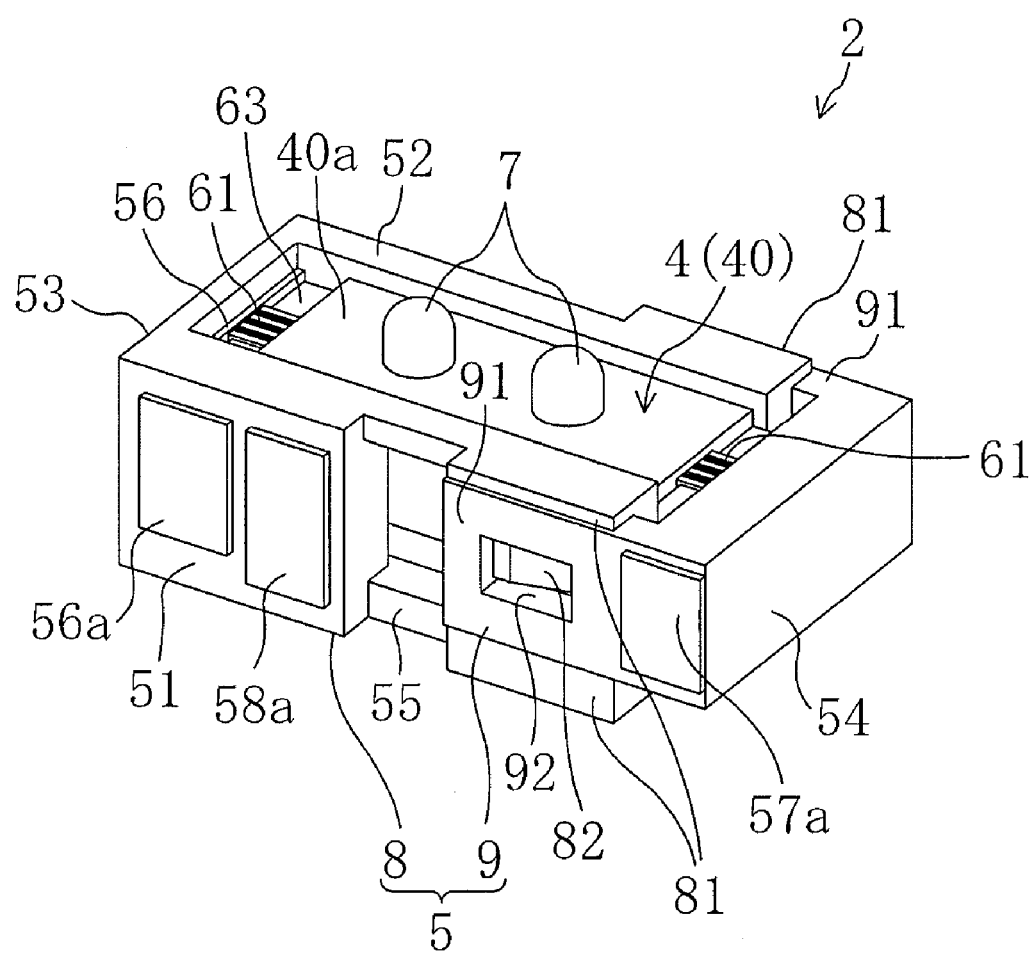
FIG. 2 is a perspective view of the ultrasonic actuator.

The ultrasonic actuator 2 includes, as shown in FIGS. 1 and 2, an actuator body 4 which generates vibration, driver elements 7 for transmitting the driving force of the actuator body 4 to the stage 11, a case 5 for containing the actuator body 4 and a support unit 6. The support unit 6 includes support rubbers 61 interposed between the actuator body 4 and the case 5 to elastically support the actuator body 4. In addition, the support unit 6 includes a bias rubber 62 for biasing the actuator body 4 to the stage 11. The ultrasonic actuator 2 functions as a vibration actuator (this applies throughout the following description).

The actuator body 4 comprises a piezoelectric element unit 40.

The piezoelectric element unit 40 is substantially in the form of a rectangular parallelepiped and has a pair of substantially rectangular principle surfaces facing each other, a pair of long side surfaces facing each other and extending in the lengthwise direction of the principle surfaces to be orthogonal to the principle surfaces, and a pair of short side surfaces facing each other and extending in the widthwise direction of the principle surfaces to be orthogonal to both of the principle surfaces and the long side surfaces.

Figure 4:
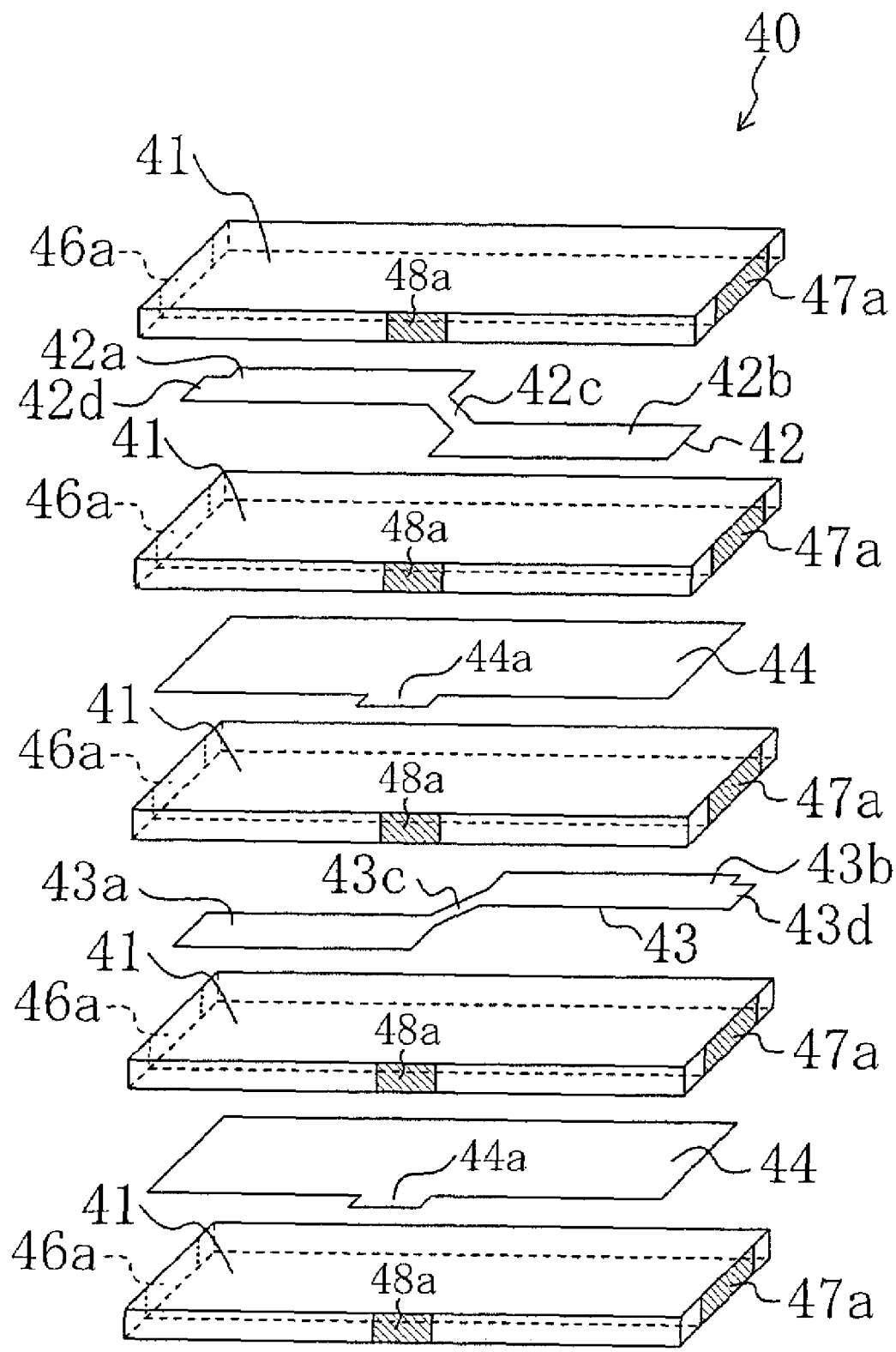
FIG. 4 is an exploded perspective view of a piezoelectric element unit.

As shown in FIG. 4, the piezoelectric element unit 40 is provided by alternately stacking five piezoelectric layers (piezoelectric elements) 41 and four internal electrode layers 42, 44, 43 and 44. Specifically, the internal electrode layers 42, 44, 43 and 44 are a first feeding electrode layer 42, a common electrode layer 44, a second feeding electrode layer 43 and a common electrode layer 44 stacked in this order alternately with the piezoelectric layers 41. The first feeding electrode layer 42, the second feeding electrode layer 43 and the common electrode layers 44 are printed on the principle surfaces of the piezoelectric layers 41, respectively.

Each of the piezoelectric layers 41 is an insulating layer made of ceramic such as lead zirconate titanate. Similar to the piezoelectric element unit 40 in general, the piezoelectric layer 41 is substantially in the form of a rectangular parallelepiped and has a pair of principle surfaces, a pair of long side surfaces and a pair of short side surfaces. Each of the piezoelectric layers 41 is provided with an external electrode 48a formed in the middle of one of the long side surfaces in the lengthwise direction, an external electrode 46a formed in the middle of one of the short side surfaces in the widthwise direction and an external electrode 47a formed in the middle of the other short side surface in the widthwise direction.

Each of the common electrode layers 44 is substantially rectangular and covers almost all the principle surface of the corresponding piezoelectric layer 41. The common electrode layer 44 has a lead electrode 44a extending from the lengthwise middle of one of the long sides of the common electrode layer 44 to the external electrode 48a of the piezoelectric layer 41.

Figure 5:
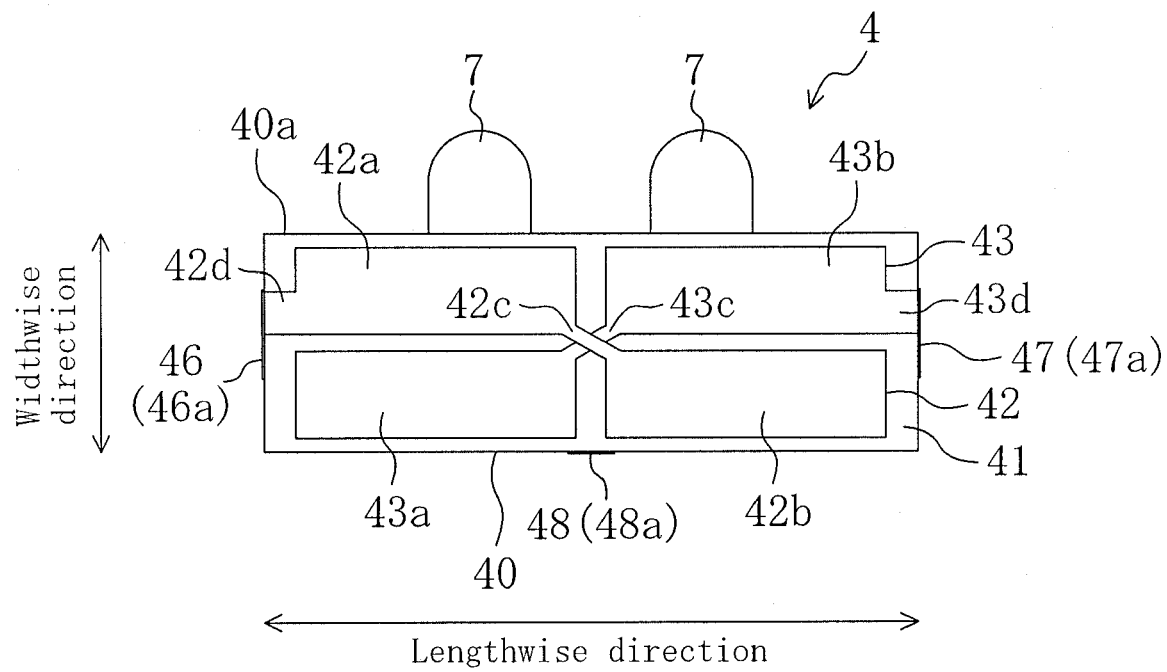
FIG. 5 is a schematic front view illustrating the schematic structure of an actuator body.

Suppose that the principle surface of the piezoelectric layer 41 is divided in four quadrants, i.e., two areas in the lengthwise direction and two areas in the widthwise direction. The first feeding electrode layer 42 includes a pair of first electrodes 42a and 42b formed on one of pairs of the diagonally aligned areas of the principle surface of the corresponding piezoelectric layer 41, and a conductive electrode 42c that connects the first electrodes 42a and 42b to bring them into electrical conduction as shown in FIG. 5. The first electrode 42a (42b) is a substantially rectangular electrode and overlaps the common electrode layer 44 when viewed in the stacking direction. That is, the first electrode 42a (42b) is opposed to the common electrode layer 44 with the piezoelectric layer 41 interposed therebetween. One of the first electrodes 42a and 42b, i.e., the first electrode 42a, is provided with a lead electrode 42d extending to the external electrode 46a of the piezoelectric layer 41.

The second feeding electrode layer 43 includes a pair of second electrodes 43a and 43b formed on the other pair of the diagonally aligned areas of the piezoelectric surface of the corresponding piezoelectric layer 41, and a conductive electrode 43c that connects the second electrodes 43a and 43b to bring them into electrical conduction. As viewed in the stacking direction, the second electrode 43a is provided to be adjacent to the first electrode 42a in the widthwise direction and adjacent to the first electrode 42b in the lengthwise direction, while the second electrode 43b is provided to be adjacent to the first electrode 42a in the lengthwise direction and adjacent to the first electrode 42b in the widthwise direction. The second electrode 43a (43b) is a substantially rectangular electrode and overlaps the common electrode layer 44 when viewed in the stacking direction. That is, the second electrode 43a (43b) is opposed to the common electrode layer 44 with the piezoelectric layer 41 interposed therebetween. One of the second electrodes 43a and 43b, i.e., the second electrode 43b, is provided with a lead electrode 43d extending to the external electrode 47a of the piezoelectric layer 41.

In the piezoelectric element unit 40 provided by alternately stacking the piezoelectric layers 41 and the internal electrode layers 42, 44, 43 and 44, the external electrodes 48a of the piezoelectric layers 41 are aligned in the stacking direction in the middle of one of the long side surfaces of the piezoelectric element unit 40 in the lengthwise direction to function as a single external electrode 48. The lead electrodes 44a of the common electrode layers 44 are electrically connected to the external electrode 48. Likewise, the external electrodes 46a of the piezoelectric layers 41 are aligned in the stacking direction in the middle of one of the short side surfaces of the piezoelectric element unit 40 in the widthwise direction to function as a single external electrode 46. The lead electrode 42d of the first feeding electrode layer 42 is electrically connected to the external electrode 46. Further, the external electrodes 47a of the piezoelectric layers 41 are aligned in the stacking direction in the middle of the other short side surface of the piezoelectric element unit 40 in the widthwise direction to function as a single external electrode 47. The lead electrode 43d of the second feeding electrode layer 43 is electrically connected to the external electrode 47. The external electrodes 46, 47 and 48 function as on-actuator body feeding electrodes.

Continuing to refer to FIG. 5, on the other long side surface 40a of the piezoelectric element unit 40, i.e., the long side surface where the external electrode 48 is not formed (one of a pair of long side surfaces of the piezoelectric element unit 40 facing the direction of bending vibration described later, hereinafter may be referred to as a mount surface), two driver elements 7 are provided.

The driver elements 7 are columnar elements having hemispherical tops and made of zirconia, alumina, silicon nitride, silicon carbide, tungsten carbide or the like. The driver elements 7 are bonded to the mount surface 40a using an adhesive. The adhesive may be made of material softer than the material of the piezoelectric element unit 40 and the material of the driver elements 7. Specifically, the adhesive may be made of a synthetic resin, especially an epoxy resin and a silicone resin. With use of such material, the driver elements 7 and the mount surface 40a are fixed together while the vibrations of the piezoelectric element unit 40 to be described later are not hindered as much as possible.

The driver elements 7 are arranged on the mount surface 40a at positions inside from the ends of the mount surface 40a in the lengthwise direction of the piezoelectric element unit 40 by 30 to 35% of the total length of the mount surface 40a. The positions correspond to the antinodes of the second mode of bending vibration of the piezoelectric element unit 40 described later, i.e., positions at which the maximum vibration occurs.

The external electrode 48 is connected to electrical ground and AC voltages having the same predetermined frequencies are applied to the external electrodes 46 and 47 with the phases of the AC voltages shifted from each other by 90°. Accordingly, an AC voltage is applied to the pair of first electrodes 42a and 42b arranged along the diagonal line of the principle surface of the piezoelectric layer 41. Another AC voltage having a phase shifted by 90° from that of the former AC voltage is applied to the pair of second electrodes 43a and 43b arranged along the other diagonal line of the principle surface of the piezoelectric layer 41. This induces longitudinal vibration in the lengthwise direction of the piezoelectric element unit 40 (so-called stretching vibration) and bending vibration in the widthwise direction (so-called transverse vibration) of the piezoelectric element unit 40.

Figure 6:
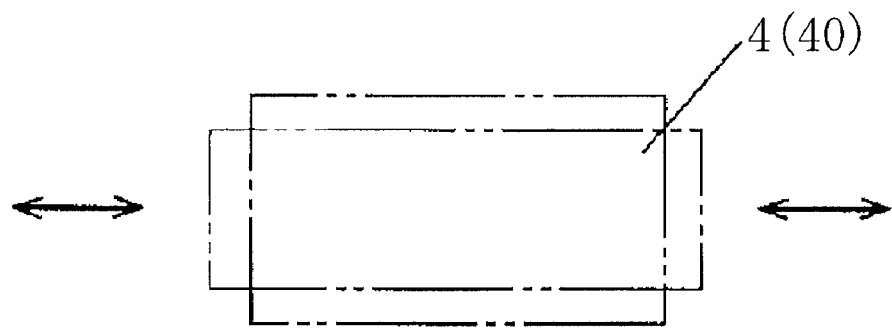
FIG. 6 is a conceptual diagram illustrating the displacement of the actuator body in the first mode of longitudinal vibration in the lengthwise direction of the actuator body.
Figure 7:
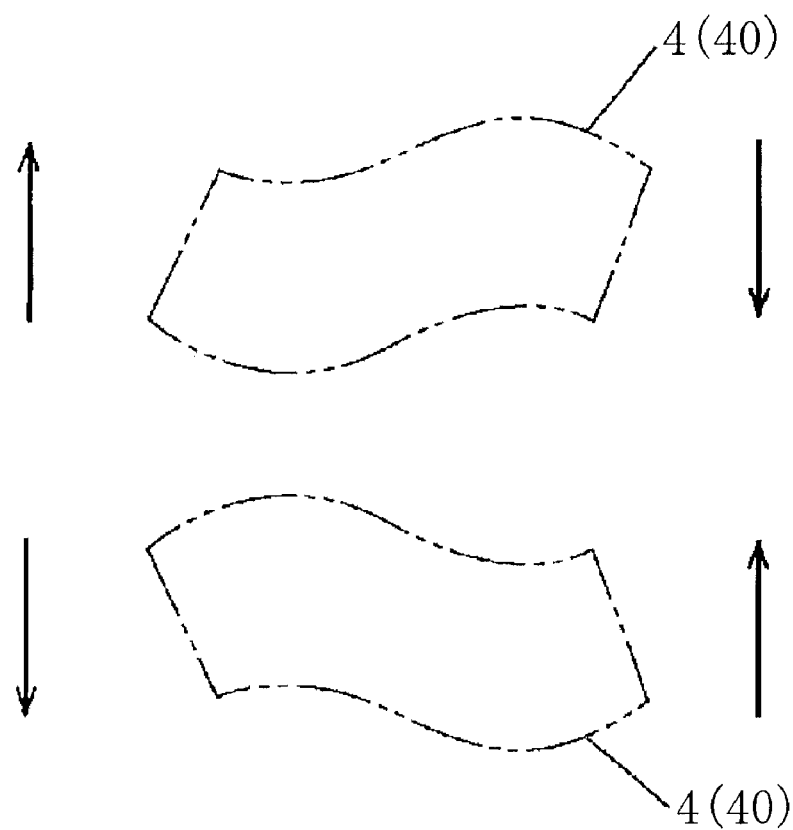
FIG. 7 is a conceptual diagram illustrating the displacement of the actuator body in the second mode of bending vibration.
Figure 8A:
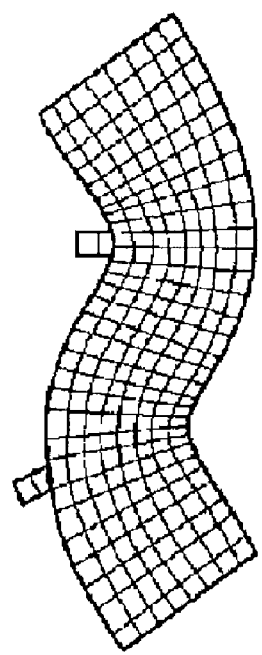
FIGS. 8A to 8D are conceptual diagrams illustrating the movement of the actuator body.
Figure 8B:
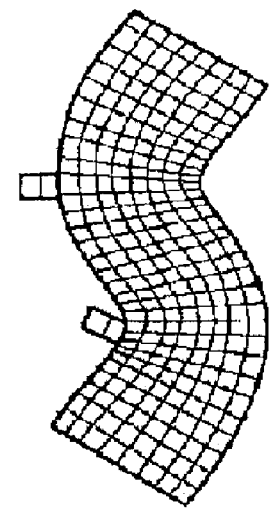
Figure 8C:
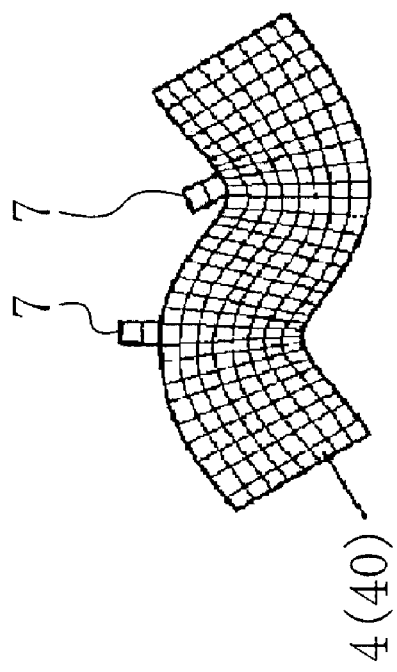
Figure 8D:
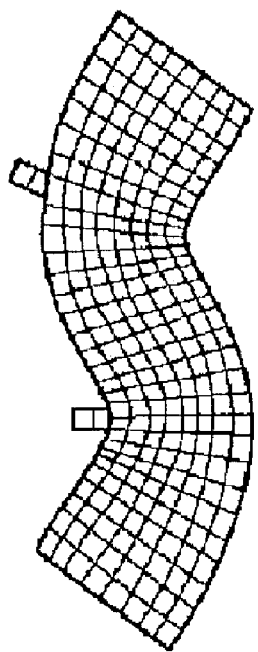

Resonance frequencies of the longitudinal vibration and the bending vibration are determined by the material and the shape of the actuator body 4, i.e., those of the piezoelectric element unit 40. The resonance frequencies are also varied depending on the force supporting the actuator body 4 and positions at which the actuator body 4 is supported. With these facts in mind, the resonance frequencies are adjusted so as to be substantially equal. AC voltages having a frequency close to the adjusted resonance frequency are applied to the external electrodes 46 and 47, respectively, while the phases of the AC voltages are shifted from each other by 90°. For example, if the shape of the piezoelectric element unit 40 is designed such that the first mode of longitudinal vibration (see FIG. 6) and the second mode of bending vibration (see FIG. 7) have the same resonance frequency and the AC voltages having a frequency close to the resonance frequency are applied with their phases shifted from each other by 90° as described above, the first mode of longitudinal vibration and the second mode of bending vibration occur in harmony in the piezoelectric element unit 40. Thus, the shape of the piezoelectric element unit 40 is varied in the order shown in FIGS. 8A to 8D.

As a result, the driver elements 7 of the piezoelectric element unit 40 make a substantially elliptical motion, i.e., circular motion, on a plane parallel to the principle surface of the piezoelectric element unit 40 (a plane parallel to the page surface in FIG. 8), i.e., a plane including the lengthwise direction and the widthwise direction of the piezoelectric element unit 40 (i.e., a plane including the directions of the longitudinal and bending vibrations).

The thus-configured piezoelectric element unit 40 has a plurality of antinodes of vibration. The antinode of vibration is a point at which the maximum vibration displacement occurs. The piezoelectric element unit 40 of the present embodiment has two antinodes of longitudinal vibration situated at the short side surfaces of the piezoelectric element unit 40, respectively. Further, the piezoelectric element unit 40 has eight antinodes of bending vibration. Four of them are positioned at the lengthwise ends of the long side surfaces of the piezoelectric element unit 40, respectively, and another four of them are situated at points on the long side surfaces, each of which is inside from the lengthwise end of the long side surface by 30 to 40% of the total length of the long side surface. That is, the ultrasonic actuator 2 has ten antinodes of the stretching and bending vibrations in total. The driver elements 7 are situated at points on one of the long surfaces, i.e., the mount surface 40a, inside from the lengthwise ends of the long side surface by 30 to 35% of the total length of the long side surface.

Referring again to FIG. 1, the case 5 is substantially in the form of a rectangular parallelepiped box corresponding to the shape of the piezoelectric element unit 40. The case 5 has a pair of substantially rectangular main walls 51 and 52 parallel to the principle surface of the piezoelectric element unit 40, a first short side wall 53 provided between the short sides of the main walls 51 and 52 at one lengthwise end of the main walls 51 and 52 (the left short sides in FIG. 1), a second short side wall 54 provided between the other short sides of the main walls 51 and 52 at the other lengthwise end of the main walls 51 and 52 (the right short sides in FIG. 1), and a long side wall 55 provided between the long sides of the main walls 51 and 52 at one widthwise end of the main walls 51 and 52 (the lower long sides in FIG. 1). The case 5 is open at the other widthwise end. More specifically, the case 5 does not have a wall between the other long sides of the main walls 51 and 52 at the other widthwise end of the main walls 51 and 52 (the upper long sides in FIG. 1), i.e., a wall corresponding to the long side surface of the piezoelectric element unit 40 on which the driver elements 7 are formed.

The case 5 includes a first case 8 and a second case 9 separable from each other. The first case 8 includes main walls 51 and 52, first short side wall 53 and long side wall 55 appropriately joined substantially in the form of a box open at the aforementioned other lengthwise end and other widthwise end.

The second case 9 includes the second short side wall 54 with engagement arms 91 extending from the edges of the second short side wall 54 in the thickness direction of the actuator body 4. The engagement arms 91 are spaced to sandwich the main walls 51 and 52 of the first case 8.

Each of the main walls 51 and 52 of the first case 8 is provided with a pair of guides 81 for guiding a corresponding engagement arm 91 of the second case 9. In addition, each of the main walls 51 and 52 includes an engagement projection 82 formed between the guides 81. Each of the engagement arms 91 of the second case 9 is provided with an engagement hole 92 to be engaged with the engagement projection 82 of the first case 8.

Figure 9:
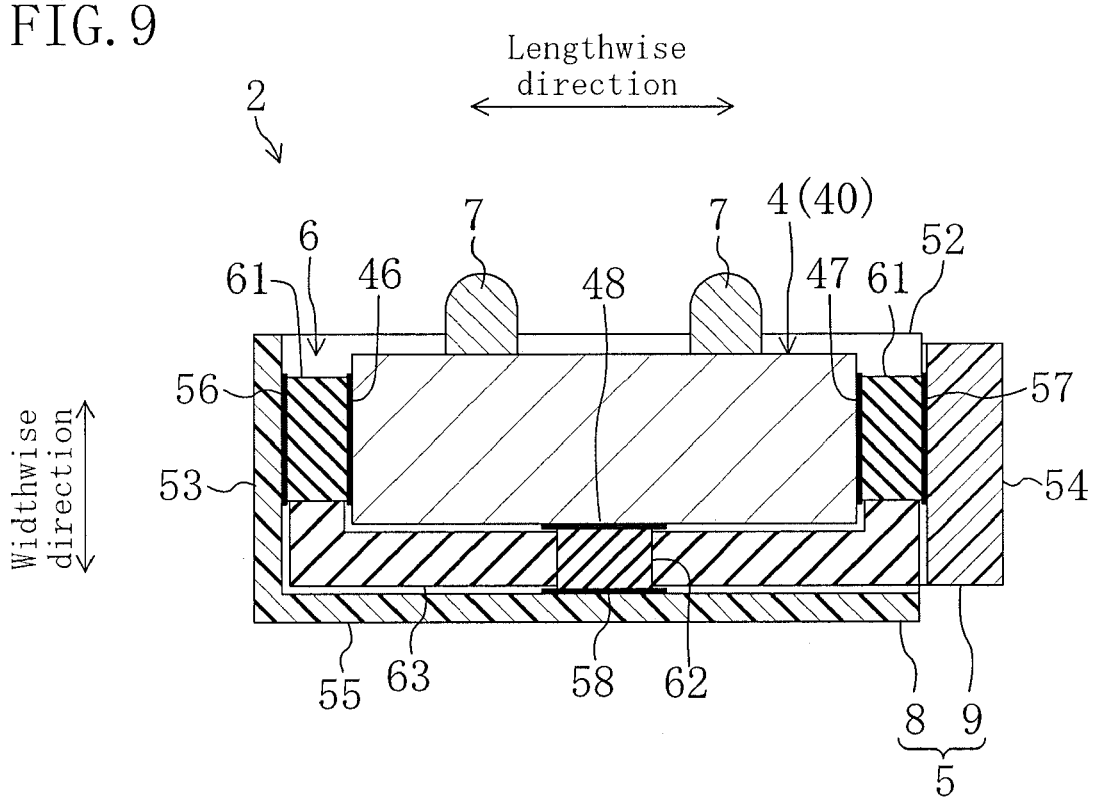
FIG. 9 is a sectional view of the ultrasonic actuator.

The first and second cases 8 and 9 are made of a resin and include electrodes 56, 57 and 58 provided by insert molding (see FIG. 9). The electrodes 56, 57 and 58 are arranged to be opposed to the external electrodes 46, 47 and 48 of the actuator body 4 contained in the case 5, respectively. Specifically, the electrode 56 is arranged on part of the inner surface of the first short side wall 53 of the first case 8 to be opposed to the external electrode 46 of the actuator body 4. The electrode 58 is arranged on part of the inner surface of the long side wall 55 of the first case 8 to be opposed to the external electrode 48 of the actuator body 4. The electrode 57 is arranged on part of the inner surface of the second short side wall 54 of the second case 9 to be opposed to the external electrode 47 of the actuator body 4. The electrodes 56 and 58 are electrically connected to terminal electrodes 56a and 58a provided on the outer surface of the main wall 51 of the first case 8. The electrode 57 is electrically connected to a terminal electrode 57a provided on the outer surface of one of the engagement arms 91 of the second case 9. The first and second cases 8 and 9 including the electrodes 56, 57 and 58 and the terminal electrodes 56a, 57a and 58a may be provided by methods other than the insert molding, such as MID (Mold Interconnection Device), as will be appreciated. The configuration of the electrodes also may be different, as will be appreciated. The electrodes 56, 57 and 58 function as on-base feeding electrodes as discussed in more detail below.

The support unit 6 includes the support rubbers 61, the bias rubber 62 and a coupling rubber 63 for coupling the support rubbers 61 and the bias rubber 62. The support unit 6 is substantially U-shaped.

Figure 10:
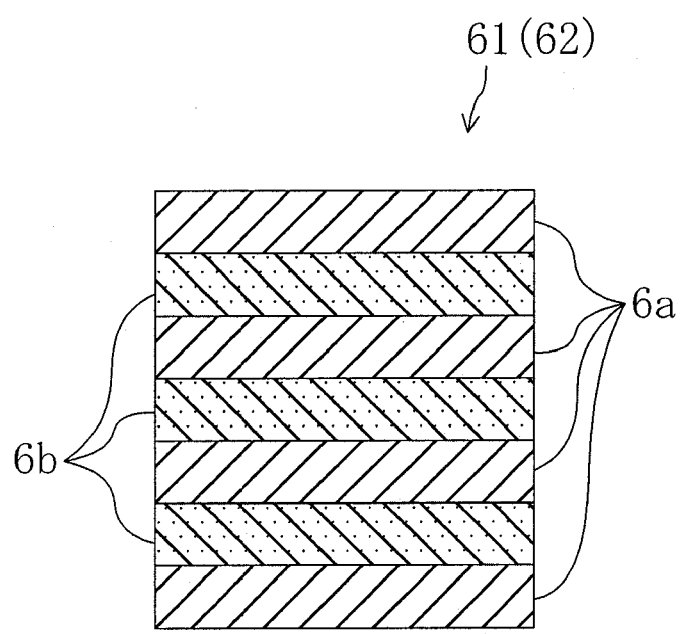
FIG. 10 is a sectional view illustrating a support rubber and a bias rubber.

Each of the support rubbers 61 is substantially in the form of a rectangular parallelepiped as shown in FIG. 10. In the exemplary embodiment, the support rubbers 61 are made of conductive rubber prepared by alternately stacking insulating rubber layers 6a, and conductive layers 6b made of a mixture of rubber and metal powder (e.g., silver powder). The support rubbers 61 elastically support the actuator body 4 in the lengthwise direction of the actuator body 4 (i.e., the lengthwise direction corresponds to the support direction). Moreover, the support rubbers 61 apply a compressive force to the actuator body 4 in the lengthwise direction of the actuator body 4. The stacked insulating rubber layers 6a and conductive layers 6b thus make up a conductive rubber that preferably has a coefficient of elasticity of $1/100$ or lower of that of the actuator body 4. The coefficient of elasticity is selected such that the vibrations of the actuator body 4 are not hindered and the ultrasonic actuator 2 is provided with high efficiency. The support rubbers 61 function as pressurizing elements. The insulating layers 6a function as insulators and the conductive layers 6b function as conductors, as will be appreciated.

Just like the support rubbers 61, the bias rubber 62 is also substantially in the form of a rectangular parallelepiped and made of conductive rubber prepared by alternately stacking insulating rubber layers 6a and conductive layers 6b made of a mixture of rubber and metal powder (e.g., silver powder). The bias rubber 62 is adapted to bias the actuator body 4 toward the stage 11. The bias rubber 62 therefore functions as a biasing element.

Each of the conductive layers 6b used in the support rubbers 61 and the bias rubber 62 varies in conductivity depending on its compressibility. For example, the conductivity increases when the conductive layer is compressed to some extent. When the support rubbers 61 and the bias rubber 62 are assembled into the ultrasonic actuator 2 and the ultrasonic actuator 2 is arranged against the stage 11 as described later, they are compressed to some extent depending on the characteristic of the conductive rubber.

The coupling rubber 63 is made of insulating rubber which is less hard than the support rubbers 61 and the bias rubber 62. The coupling rubber 63 includes a long side part 63a and short side parts 63b rising from the lengthwise ends of the long side part 63a. That is, the coupling rubber 63 is substantially U-shaped. The bias rubber 62 is embedded in the lengthwise center of the long side part 63a to penetrate the long side part 63a in the thickness direction thereof (corresponding to the widthwise direction of the actuator body 4). Further, the support rubbers 61 are embedded in the distal ends of the short side parts 63b to penetrate the short side parts 63b in the thickness direction thereof (corresponding to the lengthwise direction of the actuator body 4), respectively. In this state, the support rubbers 61 and the bias rubber 62 protrude inward and outward from the U-shaped coupling rubber 63. Further, the support rubbers 61 and the bias rubber 62 are arranged such that the stacking direction of the insulating and conductive layers in the support rubbers 61 and the bias rubber 62 is parallel to the normal direction of the U-shaped surface of the coupling rubber 63, i.e., the widthwise direction of the long side part 63a (corresponding to the thickness direction of the actuator body 4).

The interval between the support rubbers 61 is substantially the same as the lengthwise dimension of the actuator body 4. When the support unit 6 is fitted on the outer circumference of the actuator body 4, the bias rubber 62 comes into contact with or is opposed to the external electrode 48 of the actuator body 4. One of the support rubbers 61 comes into contact with or is opposed to the external electrode 46 of the actuator body 4, and the other support rubber 61 comes into contact with or is opposed to the external electrode 47 of the actuator body 4.

Now, the assembly of the ultrasonic actuator 2 will be described.

Initially, the actuator body 4 and the support unit 6 are placed in the first case 8. Specifically, the support unit 6 is placed in the first case 8 such that one of the support rubbers 61 of the support unit 6 comes into contact with the electrode 56 on the first short side wall 53 of the first case 8, and the bias rubber 62 of the support unit 6 comes into contact with the electrode 58 on the long side wall 55 of the first case 8. The actuator body 4 is placed in the support unit 6 such that the external electrode 48 comes into contact with the bias rubber 62 of the support unit 6, the external electrode 46 comes into contact with or adjacent to one of the support rubbers 61 of the support unit 6, and the external electrode 47 comes into contact with or adjacent to the other support rubber 61 of the support unit 6.

In this state, the other support rubber 61 of the support unit 6 partially or entirely protrudes outward from the open end of the first case 8.

As will be appreciated, the assembling order may be changed. The support unit 6 may be placed in the first case 8 and then the actuator body 4 may be placed in the support unit 6 as described above. Alternatively, the actuator body 4 combined with the support unit 6 may be placed in the first case 8.

The second case 9 is then coupled to the first case 8. First, the open end of the first case 8 is sandwiched by the engagement arms 91 of the second case 9. As the second case 9 is pushed toward the first case 8 in the lengthwise direction from the open end to the other end of the case 8, the engagement arms 91 of the second case 9 move along the guides 81 of the first case 8 to come up onto the engagement protrusions 82 (only one of them is shown in FIG. 1). The electrode 57 provided on the inner surface of the second short side wall 54 of the second case 9 is brought into contact with the other support rubber 61 of the support unit 6. As the second case 9 is further pressed toward the first case 8, the support unit 6 is compressed and deformed in the lengthwise direction. At the same time, the engagement holes 92 of the engagement arms 91 engage with the engagement protrusions 82, and the engagement arms 91 on the engagement protrusions 82 come down to the original state in a snap-fit arrangement. In this way, the second case 9 is coupled to the first case 8 and the ultrasonic actuator 2 is assembled.

In the thus-assembled ultrasonic actuator 2, the actuator body 4 is contained in the case 5 with the driver elements 7 protruding outward and the support unit 6 interposed between the actuator body 4 and the case 5 as shown in FIGS. 2 and 9.

In this state, one of the support rubbers 61 is interposed between the external electrode 46 of the actuator body 4 and the electrode 56 of the case 5 to bring them into electrical conduction. The other support rubber 61 is interposed between the external electrode 47 of the actuator body 4 and the electrode 57 of the case 5 to bring them into electrical conduction. Further, the bias rubber 62 is interposed between the external electrode 48 of the actuator body 4 and the electrode 58 of the case 5 to bring them into electrical conduction. As the support rubbers 61 and the bias rubber 62 protrude toward the actuator body 4 and the case 5 from the coupling rubber 63, the coupling rubber 63 does not hinder the support rubbers 61 and the bias rubber 62 from coming into contact with the external electrodes 46, 47 and 48 and the electrodes 56, 57 and 58, respectively. However, the coupling rubber 63 may be configured to be in contact with the actuator body 4 or the case 5 as long as it does not hinder the contact of the support rubbers 61 and the bias rubber 62 with the external electrodes 46, 47 and 48 and the electrodes 56, 57 and 58 and the vibrations of the actuator body 4.

As the second case 9 is coupled to the first case 8, the support rubbers 61 are compressed and deformed in the lengthwise direction. In this state, the support rubbers 61 elastically support the actuator body 4 in the lengthwise direction relative to the case 5 and apply an inward compressive force to the actuator body 4 from both sides of the actuator body 4 in the lengthwise direction i.e., in the direction of longitudinal vibration. The short side surfaces of the actuator body 4 correspond to the antinodes of the longitudinal vibration, i.e., non-node parts. Even if the support rubbers 61 come into contact with the antinodes, the support rubbers 61 do not hinder the longitudinal vibration of the actuator body 4 because they are elastic bodies. In this state, the support rubbers 61 are compressed and exhibit appropriate conductivity. The "non-node parts" are parts of the actuator body other than the nodes of vibration.

Since the coupling rubber 63 is less hard, or more compliant, than the bias rubber 62, the coupling rubber 63 is more compressed and deformed than the bias rubber 62 in the lengthwise direction. On the other hand, the bias rubber 62 is hardly deformed in the widthwise direction and does not bias the actuator body 4 in the widthwise direction until the ultrasonic actuator 2 is placed against the stage 11. However, the bias rubber 62 may be configured to bias the actuator body 4 in the widthwise direction even when the ultrasonic actuator 2 is not yet placed against the stage 11. That is, the bias rubber 62 may be placed in the case 5 in the compressed and deformed state.

Then, the thus-assembled ultrasonic actuator 2 is placed against the stage 11 such that the lengthwise direction of the actuator body 4 is parallel to the lengthwise direction of the guides 12 and the driver elements 7 are in contact with one of the surfaces of the stage 11 parallel to the guides 12. At the same time, the case 5 of the ultrasonic actuator 2 is fixed to a base such that the driver elements 7 are pressed toward the stage 11 and the bias rubber 62 is compressed and deformed. That is, when the ultrasonic actuator 2 is placed against the stage 11, the actuator body 4 is biased by the bias rubber 62 in the direction in which the actuator body 4 comes into contact with the stage 11, i.e., it is biased in the normal direction of the long side surface of the actuator body 4 (the long side surface of the piezoelectric element unit 40) on which the driver elements 7 are provided (corresponding to the widthwise direction of the actuator body 4). In this state, the bias rubber 62 is compressed and exhibits appropriate conductivity.

Further, signal lines from a control unit (not shown) are electrically connected to the terminal electrodes 56a, 57a and 58a of the case 5 through connecting pins.

The control unit receives an externally applied operation command and applies AC voltages having a frequency corresponding to the operation command to the terminal electrodes 56a and 57a. The AC voltages have their phases shifted from each other in accordance with the operation command.

As described above, the control unit allows the actuator body 4 (the piezoelectric element unit 40) to generate the longitudinal and bending vibrations in harmony such that the driver elements 7 make the circular motion as shown in FIGS. 8A to 8D and the stage 11 moves. To be more specific, for the purpose of preventing abnormal heat generation by the piezoelectric element unit 40, AC voltages having a frequency slightly higher than a common resonance frequency of the longitudinal and bending vibrations of the piezoelectric element unit 40 are applied to the terminal electrodes 56a and 57a with their phases shifted from each other by 90°.

As the piezoelectric element unit 40 generates the composite vibration of longitudinal and bending vibrations, the driver elements 7 make a circular motion on the plane including the lengthwise and widthwise directions of the actuator body 4. As a result, the driver elements 7 periodically come in and out of contact with the stage 11 to apply a driving force to the stage 11 in the lengthwise direction of the actuator body 4 through friction. Therefore, the stage 11 moves along the guides 12. The lengthwise direction of the actuator body 4 (the extending direction of the guides 12) corresponds to the driving direction in which the driver elements 7 output the driving force.

Hereinafter, how the ultrasonic actuator 2 drives the stage 11 will be described in detail with reference to FIGS. 11A to 11C. When the actuator body 4 stretches in the lengthwise direction (the direction of the longitudinal vibration), one of the driver elements 7 (e.g., left one in FIG. 11) moves in the lengthwise direction to pass closer to the stage 11 than to the actuator body 4 in the widthwise direction (the direction of the bending vibration) as shown in FIG. 11B and applies increased friction against the stage 11. With this friction, the stage 11 is displaced toward the moving direction of the one of the driver elements 7 in the lengthwise direction (to the left in FIG. 11). At the same time, the other driver element 7 (right one in FIG. 11) moves in the lengthwise direction opposite from the moving direction of the former driver element 7 to pass closer to the actuator body 4 than to the stage 11 in the widthwise direction (to be spaced from the stage 11). Therefore, the friction between the driver element 7 and the stage 11 is reduced or zero. Thus, the latter driver element 7 has little influence on the displacement of the stage 11.

Figure 11A:
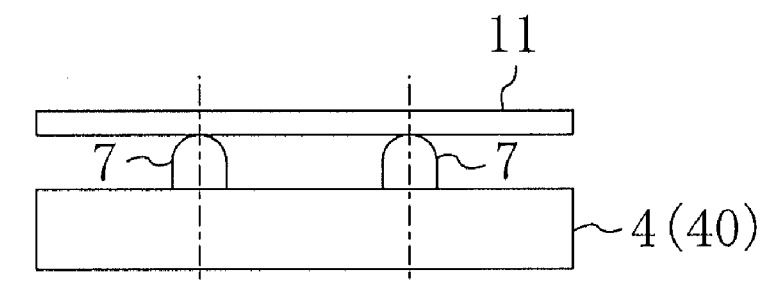
FIGS. 11A to 11C are conceptual diagrams illustrating how a stage is driven by the ultrasonic actuator.
Figure 11B:
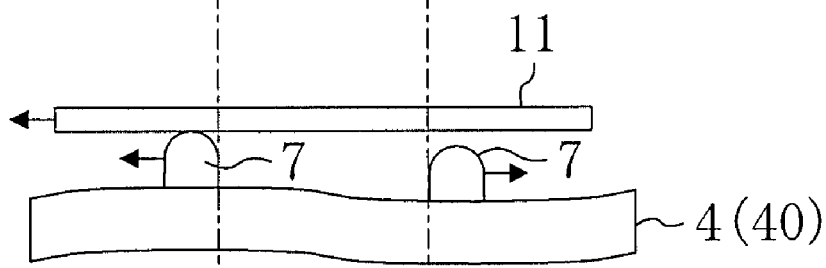
Figure 11C:
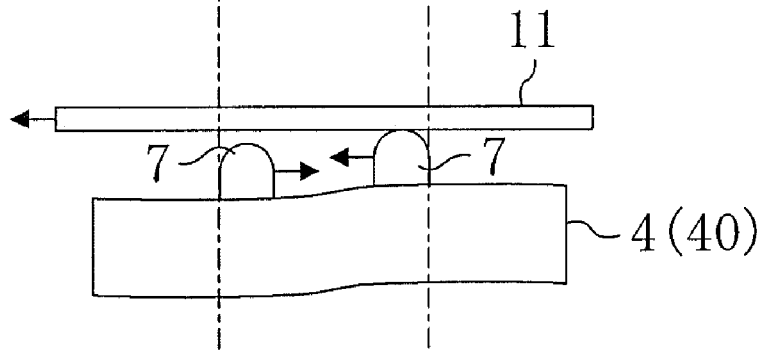

In the case where the actuator body 4 contracts in the lengthwise direction, the latter driver element 7 (right one in FIG. 11) moves in the lengthwise direction to pass closer to the stage 11 than to the actuator body 4 in the widthwise direction as shown in FIG. 11C and applies increased friction against the stage 11. With this friction, the stage 11 is displaced toward the moving direction of the latter driver element 7 in the lengthwise direction (to the left in FIG. 11). The direction of the displacement in this case is the same as the moving direction of the stage 11 driven by the former driver element 7 when the actuator body 4 is stretched. At the same time, the former driver element 7 (left one in FIG. 11) moves in the lengthwise direction opposite from the moving direction of the latter driver element 7 to pass closer to the actuator body 4 than to the stage 11 in the widthwise direction. Therefore, the friction between the former driver element 7 and the stage 11 is reduced or zero. Thus, the former driver element 7 has little influence on the displacement of the stage 11.

In FIGS. 11A to 11C, the one of the driver elements 7 having little influence on the displacement of the stage 11 is depicted as being spaced from the stage 11. However, the driver element 7 is not always spaced from the stage 11. That is, the driver element 7 may remain in contact with the stage 11 with the friction applied to such a degree that the stage 11 is not moved.

In this manner, the two driver elements 7 alternately allow the stage 11 to move in the same direction with their phases are shifted from each other by 180°. If the AC voltages with their phases shifted from each other by −90° are applied to the terminal electrodes 56a and 57a, the driver elements 7 deliver the driving force in the opposite direction such that the stage 11 moves in the opposite direction (to the right in FIG. 11).

The travel distance, traveling speed and traveling acceleration of the stage 11 are adjusted by controlling at least one of the voltage value, the frequency and the feeding period of the AC voltages applied to the terminal electrodes 56a and 57a. Alternately, the adjustment may be carried out by changing the value of phase difference between the AC voltages applied to the terminal electrodes 56a and 57a.

In this manner, the driver elements 7 make the circular motion on a plane including the direction of the longitudinal vibration (lengthwise direction) and the direction of the bending vibration (widthwise direction) to repeatedly increase and decrease the friction between the driver elements 7 and the stage 11. Thus, the ultrasonic actuator 2 drives the stage 11.

When the ultrasonic actuator 2 is operated as described above, the actuator body 4 vibrates and a compressive stress and a tensile stress of the same level occur in the piezoelectric layers 41. The piezoelectric layers 41 are made of brittle material such as ceramic or quartz. The compressive strength of the brittle material is several times higher than its tensile strength. That is, the piezoelectric layers 41 are sensitive to tensile deformation. Therefore, when electric power as high as about 10 mW to 10 W is applied to the ultrasonic actuator 2 and the piezoelectric layers 41 are greatly displaced, strain of the piezoelectric layers 41 in the tensile direction exceeds the elastic limit of the piezoelectric layers 41. As a result, the piezoelectric layers 41 or the actuator body 4 may break.

According to the ultrasonic actuator 2 of the present embodiment, the support rubbers 61 apply the compressive force in advance to the non-node parts of the actuator body 4 (antinodes of the longitudinal vibration) in the direction parallel to the direction of the longitudinal vibration. Therefore, the tensile stress is reduced as compared with the compressive stress applied to the piezoelectric layers 41. Even if the piezoelectric layers 41 are greatly displaced, the tensile stress is less likely to exceed the elastic limit of the piezoelectric layers 41. As a result, the actuator body 4 is prevented from breaking and improves in reliability.

The compressive force applied to the actuator body 4 is preferably applied to parts of the actuator body 4 symmetric with each other with respect to the center of gravity of the actuator body 4. With this configuration, the symmetry of the longitudinal vibration and the bending vibration is ensured. Therefore, the elliptical motion of the driver elements 7 is stabilized and the characteristic of the ultrasonic actuator 2 is stably exhibited. To be more specific, when the compressive force is applied parallel to the direction of the longitudinal vibration in the lengthwise direction, the compressive force is preferably applied to parts of the actuator body 4 symmetric in the widthwise direction and the thickness direction of the actuator body 4.

As a result of applying the compressive force to the actuator body 4 in advance, an excellent effect, i.e., adjustment of the difference between the resonance frequencies of the longitudinal and bending vibrations (relationship between them), is obtained. That is, the resonance frequency [Hz] of the first mode of longitudinal vibration and the resonance frequency [Hz] of the second mode of bending vibration of the actuator body 4 are expressed by the following formulae (1) and (2):

$$f_{L1} = \frac{1}{2L}\sqrt{\frac{E}{\rho}} \quad (1)$$

$$f_{B2} = \frac{7.853W}{2\pi L^2}\sqrt{\frac{E}{12\rho}} \quad (2)$$

In the formulae (1) and (2), L is the dimension of the actuator body 4 in the direction of the longitudinal vibration [m], W is the dimension of the actuator body 4 in the direction of the bending vibration [m], E is a Young's modulus of the actuator body 4 [Pa] and $\rho$ is a density of the actuator body 4 [kg/m³]. However, the actual resonance frequencies may vary depending on variations during the manufacture, variations in size of the driver elements 7 adhered to the actuator body 4, variations in adhesion positions of the driver elements 7, etc.

Accordingly, the application of the compressive force to the actuator body 4 makes it possible to change the resonance frequencies to bring them closer to the desired resonance frequency.

Hereinafter, a method of frequency adjustment will be described in detail. With the driver elements 7 provided on the actuator body 4, a standard predetermined compressive force is applied to the piezoelectric element from the end faces of the piezoelectric element in the direction of the longitudinal vibration toward the center of the piezoelectric element. In this state, resonance frequency $f_{L1}$ of the first mode of longitudinal vibration and resonance frequency $f_{B2}$ of the second mode of bending vibration are measured. From a design viewpoint, the resonance frequencies of the bending and longitudinal vibrations are equal. However, they may vary more or less due to variations during manufacture and assembly.

The actuator body 4 is combined with the case in such a state that the support rubbers 61 apply the compressive force to the actuator body 4 in the same direction as the direction of the longitudinal vibration from the end faces to the center of the actuator body 4. In this step, several kinds of support rubbers 61 which are different in dimension in the direction perpendicular to the compression direction (i.e., the widthwise direction or the thickness direction of the actuator body 4) from the standard support rubbers 61 are prepared. If the support rubbers 61 having a different dimension are used to combine the actuator body 4 with the case, the compressive force applied to the actuator body 4 is changed. As a result, the resonance frequency of the actuator body 4, in particular the resonance frequency of the second mode of bending vibration, is changed.

For example, if the resonance frequency $f_{B2}$ of the bending vibration is lower than the resonance frequency $f_{L1}$ of the longitudinal vibration ($f_{B2}<f_{L1}$), support rubbers 61 having a larger dimension than that of the standard support rubbers 61 are used to combine the actuator body 4 with the case 5. Accordingly, a larger compressive force than that applied by the standard support rubbers 61 is applied to the actuator body 4. On the other hand, if the resonance frequency $f_{B2}$ of the bending vibration is higher than the resonance frequency $f_{L1}$ of the longitudinal vibration ($f_{B2}>f_{L1}$), the support rubbers 61 having a smaller dimension than that of the standard support rubbers 61 are used to combine the actuator body 4 with the case 5. Accordingly, a smaller compressive force than that applied by the standard support rubbers 61 is applied to the actuator body 4. If there is only a slight difference between the resonance frequency $f_{B2}$ of the bending vibration and the resonance frequency $f_{L1}$ of the longitudinal vibration ($f_{B2}$ is approximately equal to $f_{L1}$), the standard support rubbers 61 are used to combine the actuator body 4 with the case 5. In this manner, the resonance frequencies of the longitudinal and bending vibrations are adjusted to be approximately equal even if there are variations derived from the manufacture.

In this method, the resonance frequencies are measured while the compressive force is applied only in the direction of the longitudinal vibration. However, if the measurement is carried out in such a state that the ultrasonic actuator 2 is pressed toward the stage 11 to bring the driver elements 7 and the stage 11 into frictional contact, the resonance frequencies are measured with higher precision.

In this embodiment, the compressive force applied to the actuator body 4 is adjusted by changing the dimension of the support rubbers 61. However, the compressive force applied to the actuator body 4 may be adjusted by changing the material of the support rubbers 61 or changing the dimension of the case 5. Further, instead of changing the dimension of both of the support rubbers 61, the dimension of only one of the support rubbers 61 may be changed to adjust the frequencies and the compressive force applied to the actuator body 4.

The compressive force in the direction of the longitudinal vibration applied to perform the frequency adjustment may be replaced with the compressive force in the direction of the bending vibration. The compressive force in the direction of the bending vibration may be adjusted by changing the dimension and material of the bias rubber 62 and/or pressurizing rubbers 64 to be described later.

In the above-described method, the resonance frequencies of the longitudinal and bending vibrations are adjusted to be substantially equal. However, the resonance frequency of the bending vibration may purposely be adjusted lower than the resonance frequency of the longitudinal vibration. For the ultrasonic actuator 2 of this kind, it is difficult to set the resonance frequency of the longitudinal vibration and the resonance frequency of the bending vibration exactly equal. Therefore, the ultrasonic actuator 2 is generally driven at a drive frequency higher than both of the resonance frequencies of the longitudinal and bending vibrations (i.e., AC voltages having a higher frequency than the resonance frequencies of the longitudinal and bending vibrations are applied to the terminal electrodes 56a and 57a of the actuator body 4). In such a case, if the resonance frequency of the longitudinal vibration is adjusted higher than that of the bending vibration, the longitudinal vibration occurs more predominantly in the actuator body 4 than the bending vibration because the resonance frequency of the longitudinal vibration is closer to the drive frequency than the resonance frequency of the bending vibration. Since the direction of the longitudinal vibration corresponds to the moving direction of the stage 11, the longitudinal vibration has a significant effect on the maximum speed of the ultrasonic actuator 2. To be more specific, when the resonance frequency of the longitudinal vibration is set higher than that of the bending vibration, the longitudinal vibration occurs predominantly in the actuator body 4 than the bending vibration. Therefore, advantageously, the maximum speed of the ultrasonic actuator 2 is less likely to vary when the ultrasonic actuator 2 is driven at the varied drive frequency.

Alternatively, the resonance frequency of the bending vibration may purposely be set higher than the resonance frequency of the longitudinal vibration. As described above, the ultrasonic actuator 2 which generates two vibrations in different vibration directions (longitudinal and bending vibrations) is generally driven at a drive frequency higher than both of the resonance frequencies of the longitudinal and bending vibrations. In general, the bending vibration has a small bandwidth. Therefore, when the resonance frequency of the bending vibration is set higher than that of the longitudinal vibration, the resonance frequency of the bending vibration becomes closer to the drive frequency as compared with the case where the resonance frequency of the bending vibration is lower than that of the longitudinal vibration. Therefore, the bending vibration occurs in the actuator body 4 to a sufficient degree. On the other hand, since the bandwidth of the longitudinal vibration is wider than that of the bending vibration, the longitudinal vibration surely occurs in the actuator body 4 even if the resonance frequency of the longitudinal vibration is not close to the drive frequency. When the drive frequency is not close to the resonance frequency of the longitudinal vibration, the change in maximum speed of the ultrasonic actuator in response to the change in drive frequency becomes less steep than the case where the drive frequency is changed near the resonance frequency. Therefore, advantageously, the ultrasonic actuator is operable down to a low speed range with stability.

In the ultrasonic actuator 2, since the support rubbers 61 in the compressed state are interposed between the actuator body 4 and the case 5 to apply the compressive force to the actuator body 4 in advance, the actuator body 4 is elastically supported by the support rubbers 61 relative to the case 5. Accordingly, the actuator body 4 is supported without hindering its vibrations and the efficiency of the ultrasonic actuator 2 is improved. In particular, since the support rubbers 61 support the actuator body 4 at parts of the actuator body 4 other than the nodes (the non-node parts), the hindrance to the longitudinal vibration is effectively prevented by elastically supporting the actuator body 4 by the elastic support rubbers 61.

According to the recent demand of downsizing of the ultrasonic actuator 2, the actuator body 4 is also required to be downsized. In this situation, when inelastic bodies are used to support the actuator body 4 only at the nodes thereof, it is significantly difficult to arrange the inelastic bodies exactly at the nodes of the actuator body 4 from the precision aspect. However, if the elastic bodies are used as the supports, the vibration is less hindered even if the elastic bodies are arranged at parts of the actuator body 4 other than the nodes. Therefore, high precision is no longer necessary in the manufacture. Thus, the downsized ultrasonic actuator 2 is easily manufactured and the productivity is improved.

Further, since the support rubbers 61 for supporting the actuator body 4 and applying the compressive force to the actuator body 4 in advance are made of electrically conductive rubber, and at the same time, the external electrodes 46 and 47 for applying a voltage to the piezoelectric layers 41 are located at parts of the actuator body 4 to be in contact with the support rubbers 61, and the electrodes 56 and 57 for feeding the actuator body 4 are located at parts of the case 5 to be in contact with the support rubbers 61, the electrodes 56 and 57 of the case 5 and the external electrodes 46 and 47 of the actuator body 4 are brought into electrical conduction through the support rubbers 61 and electric power is supplied from the case 5 to the actuator body 4 through the support rubbers 61. As a result, the need of connecting feeding wires to the actuator body 4 by soldering or the like is eliminated and the possibility of breakage of the actuator body 4 due to stress concentration on the soldered parts is eliminated. In addition, the dimension of the ultrasonic actuator 2 in the thickness direction is reduced by the dimension of the soldered parts removed from the surface of the actuator body 4.

In such a configuration that the support rubbers 61 in the compressed and deformed state are used to apply the compressive force to the actuator body 4 and the case 5 and the actuator body 4 are brought into electrical conduction through the support rubbers 61, the support rubbers 61 are deformed when the actuator body 4 vibrates. Therefore, if the arrangement of the support rubbers 61 is inappropriate, conduction failure may occur between the external electrodes 46 and 47 of the actuator body 4 and the support rubbers 61, or between the electrodes 56 and 57 of the case 5 and the support rubbers 61.

Figure 12:
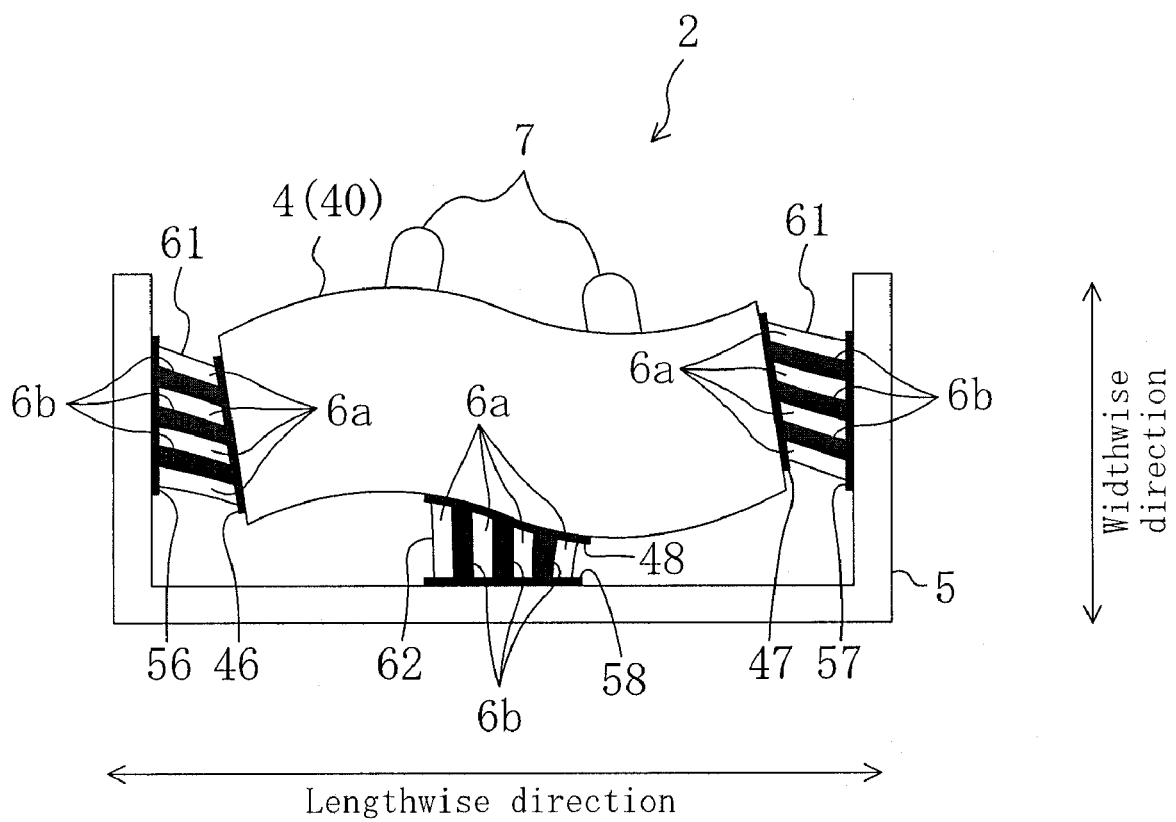
FIG. 12 is a schematic view illustrating how the ultrasonic actuator is operated when the support rubber and the bias rubber are arranged such that their stacking directions are parallel to a plane including the directions of the longitudinal and bending vibrations of the actuator body.

For example, an exemplary configuration is described below. In this configuration, the support rubbers 61 are arranged such that the stacking direction of the layers in the support rubbers 61 is parallel to the plane including the directions of the longitudinal and bending vibrations of the actuator body 4 as shown in FIG. 12. Since the support rubbers 61 are intended to bring the external electrodes 46 and 47 of the actuator body 4 and the electrodes 56 and 57 of the case 5 into electrical conduction, the surfaces of the support rubbers on each of which the end faces of the conductive layers 6b are exposed are brought into contact with the external electrodes 46 and 47 and the electrodes 56 and 57. That is, the support rubbers 61 are arranged such that the stacking direction corresponds to the widthwise direction of the actuator body 4.

When the ultrasonic actuator 2 is operated in this state, the surfaces of the support rubbers 61 in contact with the external electrodes 46 and 47 or the electrodes 56 and 57 may be altered in quality and conduction failure may occur. A possible cause of the failure is described below.

When the actuator body 4 makes the longitudinal and bending vibrations in harmony, the support rubbers 61 are stretched in the direction of the longitudinal vibration of the actuator body 4. At the same time, the support rubbers 61 undergo shear deformation in the direction of the bending vibration of the actuator body 4. As a result, the compressibility of the support rubbers 61 varies. Specifically, each of the support rubbers 61 shows variations in compressibility at different parts thereof along the widthwise direction of the actuator body 4. Since the widthwise direction of the actuator body 4 corresponds to the stacking direction of the support rubbers 61, the conductive layers 6b have different compressibilities. When a conductive layer 6b decreases in compressibility, it increases in resistance value and generates larger heat. Therefore, due to significant temperature increase, the surface of the conductive layer 6b in contact with the external electrode 47 (46) or the electrode 57 (56) may be altered in quality and the electrical conduction may be lost. Further, in some cases, if the compressibility is reduced, the conductive layer 6b may be separated from the external electrode 47 (46)

or the electrode 57 (56). When the separated conductive layer comes into contact again with the external electrode 47 (46) or the electrode 57 (56), sparking occurs and localized extreme temperature rise occurs. Thus, the conductive layer 6b may be altered.

The change in compressibility is derived from not only the vibrations of the actuator body 4 but also how the ultrasonic actuator 2 is placed against the stage 11. To be more specific, according to the present embodiment, the support rubbers 61 are in the compressed and deformed state to apply the compressive force to the actuator body 4 and the bias rubber 62 is hardly deformed before the ultrasonic actuator 2 is placed against the stage 11. When the ultrasonic actuator 2 is placed against the stage 11 such that the driver elements 7 are pressed toward the stage 11, the actuator body 4 sinks down on the bias rubber 62 to compress and deform the bias rubber 62. In the state where the support rubbers 61 apply the compressive force to the actuator body 4, the friction between the support rubbers 61 and the actuator body 4 is high. Therefore, when the actuator body 4 is displaced relative to the support rubbers 61 in the direction parallel to its surface in contact with the support rubbers 61, the support rubbers 61 hardly slide on the actuator body 4 but undergo shear deformation in response to the displacement of the actuator body 4. As a result, the compressibility of the support rubbers 61 varies in the widthwise direction of the actuator body 4. If the ultrasonic actuator 2 is kept operated in this state, the support rubbers 61 may extremely be heated and altered as described above.

This phenomenon may occur also in the bias rubber 62 which is arranged in the compressed and deformed state to press the driver elements 7 toward the stage 11 and bias the actuator body 4.

The bias rubber 62 is arranged such that the stacking direction of the conductive rubber layers is parallel to the plane including the directions of the longitudinal and bending vibrations of the actuator body 4, and the end faces of the conductive layers 6b come into contact with the external electrode 48 of the actuator body 4 and the electrode 58 of the case 5. Specifically, the bias rubber 62 is arranged such that the stacking direction corresponds to the lengthwise direction of the actuator body 4. The bias rubber 62 is arranged at the node of the longitudinal and bending vibrations of the actuator body 4. Therefore, the degree of change in compressibility in response to the longitudinal and bending vibrations of the actuator body 4 is smaller than that of the support rubbers 61. However, the same phenomenon may occur. To be more specific, the lengthwise center of the long side surface of the actuator body 4, which is the node of the longitudinal and bending vibrations, is hardly deformed even if the actuator body 4 makes the longitudinal and bending vibrations. However, parts of the long side surface of the actuator body 4 other than the lengthwise center are deformed and displaced as the actuator body 4 makes the longitudinal and bending vibrations. As the bias rubber 62 has a certain dimension in the lengthwise direction of the actuator body 4, it stretches in the direction of the bending vibration and undergoes shear deformation in the direction of the longitudinal vibration of the actuator body 4 as the actuator body 4 generates the longitudinal and bending vibrations. Therefore, among the conductive layers 6b of the bias rubber 62, some of the conductive layers 6b located closer to the lengthwise ends of the actuator body 4 than to the lengthwise center of the actuator body 4 decrease in compressibility and conductivity in response to the vibrations of the actuator body 4. As a result, the some of the conductive layers 6b with decreased compressibility increase in resistance value and generate larger heat. Therefore, the surface of the bias rubber 62 in contact with the external electrode 48 or the electrode 58 may be altered and electrical conduction may be lost. Further, in some cases, the conductive layers 6b with reduced compressibility may be separated from the external electrode 48 or the electrode 58. When the separated conductive layers come into contact again with the external electrode 48 or the electrode 58, sparking occurs and localized extreme temperature rise occurs. Thus, the conductive layers 6b may be altered.

Different from the above-described configuration, the support rubbers 61 and the bias rubber 62 of the present embodiment are arranged such that their stacking directions correspond to the normal direction of the U-shaped surface of the coupling rubber 63. To be more specific, their stacking directions correspond to the direction orthogonal to the plane including the directions of the longitudinal and bending vibrations of the actuator body 4, i.e., the normal direction of the principle surface of the actuator body 4. With this configuration, the surfaces of the support rubbers 61 in contact with the external electrodes 46 and 47 or the electrodes 56 and 57 are prevented from the extreme temperature rise and the resulting alteration and the conduction failure between the support rubbers and the electrodes is prevented. A possible cause thereof is described below.

In the above-described configuration, the stacking direction of the conductive layers 6b of the support rubbers 61 and the bias rubber 62, i.e., the direction of the width of the exposed end faces of the conductive layers 6b (the widthwise direction of the end faces), corresponds to the direction along which the compressibility varies as the actuator body 4 vibrates (i.e., the direction of the shear deformation of the support rubbers 61 and the bias rubber 62). Therefore, every conductive layer 6b has different compressibilities. Accordingly, a phenomenon may occur in which the compressibility decreases entirely in one conductive layer 6b and heat is generated. In contrast, according to the present embodiment, the lengthwise direction of the end faces of the conductive layers 6b of the support rubbers 61 and the bias rubber 62 corresponds to the direction along which the compressibility varies. That is, the end faces of the conductive layers 6b extend in the direction along which the compressibility varies. Therefore, in one conductive layer 6b, the compressibility decreases in part and increases in another part. That is, the change in resistance value is absorbed in the one conductive layer 6b. As a result, the phenomenon in which the compressibility decreases entirely in one conductive layer 6b and heat is generated is prevented.

According to Embodiment 1, the compressive force is applied in advance to the antinodes of the vibrations of the actuator body 4 such that the tensile stress becomes smaller than the compressive stress applied to the actuator body 4 as the actuator body 4 vibrates. Therefore, even if the actuator body 4 is greatly displaced, the strain caused by the tensile stress is less likely to exceed the elastic limit of the actuator body 4 (the piezoelectric layers 41) and the breakage of the actuator body 4 is prevented. As a result, the reliability of the ultrasonic actuator 2 is improved.

Further, since the resonance frequencies of a plurality of vibrations are adjusted by controlling the compressive force applied in advance by the support rubbers 61, the ultrasonic actuator 2 is provided with reduced variations.

As the actuator body 4 is supported by the elastic support rubbers 61 relative to the case 5, the actuator body 4 is supported without hindering vibration. This improves the efficiency of the ultrasonic actuator 2.

The support rubbers 61 are made of conductive rubber and the external electrodes 46 and 47 of the actuator body 4 and the electrodes 56 and 57 of the case 5 are brought into electrical conduction through the support rubbers 61. This eliminates the need of connecting feeding lines to the actuator body 4 by soldering or the like. Therefore, the possibility of breakage of the actuator body 4 caused by stress concentration on the soldered parts of the actuator body 4 is eliminated. Further, as the solder put on the surface of the actuator body is no longer necessary, the thickness of the actuator body 4 is reduced by the height of the solder in the thickness direction. In addition, the step of connecting the feeding lines by soldering is omitted. Therefore, the number of steps of assembling the ultrasonic actuator 2 is reduced and the assembly becomes easier.

In the ultrasonic actuator in which the support rubbers 61 apply the compressive force in advance to the actuator body 4 and the electrical conduction between the actuator body 4 and the case 5 is realized by the support rubbers 61, the support rubbers 61 are arranged such that the stacking direction of the conductive layers 6b of the support rubbers 61 is orthogonal to the plane including the directions of the longitudinal and bending vibrations of the actuator body 4 (orthogonal to the directions of the longitudinal and bending vibrations of the actuator body 4). As a result, even if the compressibility of the support rubbers 61 varies as the actuator body 4 vibrates, each of the conductive layers 6b is able to absorb the change in compressibility, i.e., the change in conductivity. Therefore, the phenomenon in which the compressibility decreases entirely in one conductive layer 6b and heat is generated is prevented. This makes it possible to prevent the alteration of the support rubbers 61 and the occurrence of conduction failure between the actuator body 4 and the case 5. Thus, the electrical conduction between the actuator body 4 and the case 5 is ensured.

When the ultrasonic actuator 2 is arranged against the stage, the actuator body 4 is adapted to be displaced in the direction parallel to its surface in contact with the support rubbers 61 with the compressive force applied to the actuator body 4 in advance by the support rubbers 61. Also in this configuration, the support rubbers 61 are arranged such that the stacking direction of the conductive layers in the support rubbers 61 is orthogonal to the plane including the directions of the longitudinal and bending vibrations of the actuator body 4. Therefore, the change in conductivity of the support rubbers 61 due to the vibrations of the actuator body 4 is absorbed in each of the conductive layers 6b. This makes it possible to prevent the alteration and the loss of conductivity of the support rubbers 61.

In the bias rubber 62 arranged in the compressed and deformed state to press the driver elements 7 toward the stage 11, the stacking direction of the conductive layers in the bias rubber 62 is orthogonal to the plane including the directions of the longitudinal and bending vibrations of the actuator body 4 (orthogonal to the directions of the longitudinal and bending vibrations of the actuator body 4). Therefore, even if the compressibility of the bias rubber 62 varies as the vibrations of the actuator body 4 vibrates, the change in conductivity of the bias rubber 62 is absorbed in each of the conductive layers 6b and the alteration of the bias rubber 62 is prevented. Thus, good electrical conduction between the actuator body 4 and the case 5 through the bias rubber 62 is ensured.

The ultrasonic actuator 2 of Embodiment 1 includes the bias rubber 62. However, the ultrasonic actuator 2 may not include the bias rubber 62. To be more specific, instead of the bias rubber, the ultrasonic actuator 2 may include a biasing element which biases the actuator body 4 toward an object to be driven, such as the stage 11, when the ultrasonic actuator 2 is placed against the stage 11. In this configuration, the case 5 is preferably provided with an opening such that the biasing element comes into contact with the surface of the actuator body 4 on which the driver elements 7 are not provided.

According to the present embodiment, the support rubbers 61 are integrated in one piece as the support unit 6 by the coupling rubber 63. However, the support rubbers 61 may not be integrated in one piece.

Embodiment 2

An ultrasonic actuator 202 of Embodiment 2 will be described below with reference initially to FIG. 13.

The ultrasonic actuator 202 of Embodiment 2 is different from that of Embodiment 1 in that the compressive force, which is applied to the actuator body 4 only in the direction of the longitudinal vibration of the actuator body 4 in Embodiment 1, is applied in the directions of the longitudinal and bending vibrations of the actuator body 4.

Figure 13:
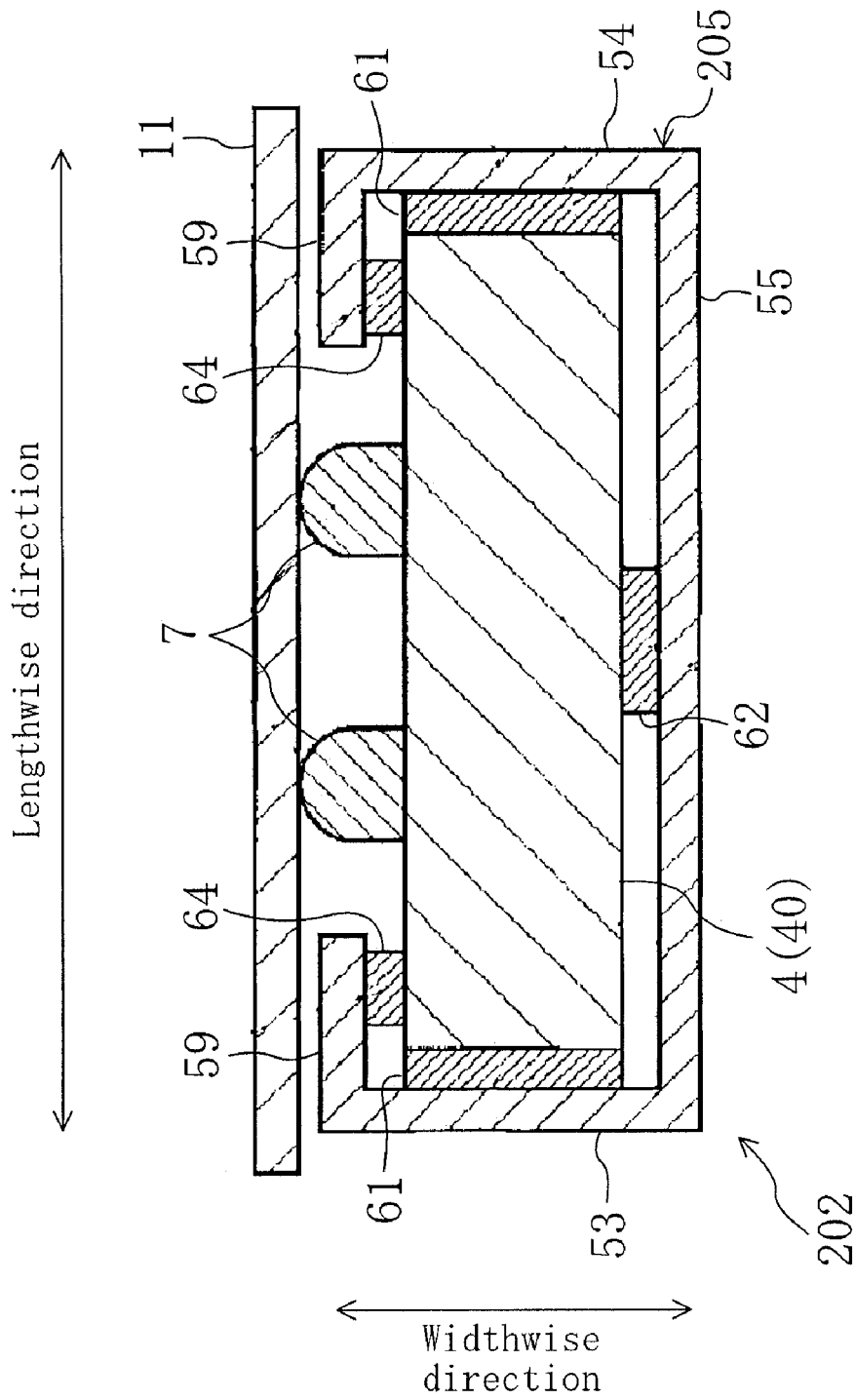
FIG. 13 is a sectional view of an ultrasonic actuator according to Embodiment 2.

To be more specific, a case 205 has, at the other side in the widthwise direction thereof (the top side as shown in FIG. 13), overhangs 59 extending inwardly in the lengthwise direction of the case 205 from the first short side wall 53 and the second short side wall 54, respectively. In other words, the overhangs 59 are provided to be opposed to the long side wall 55 of the case 205.

When the actuator body 4 is placed in the case 205, pressurizing rubbers 64 which are compressed and deformed in the widthwise direction of the actuator body 4 are provided between the actuator body 4 and the overhangs 59. The pressurizing rubbers 64 are located at the ends of the mount surface 40a of the actuator body 4, respectively. The ends are two of the ten vibration antinodes of the actuator body 4 generating the first mode of longitudinal vibration and the second mode of bending vibration.

At the same time, in the case 205, the bias rubber 62 interposed between the actuator body 4 and the long side wall 55 is also compressed and deformed. Thus, the bias rubber 62 and the pressurizing rubbers 64 apply the compressive forces to the actuator body 4 in the direction of the bending vibration.

The thus-configured ultrasonic actuator 202 is arranged such that the driver elements 7 are pressed toward the stage 11. To be more specific, the ultrasonic actuator 202 is arranged such that the bias rubber 62 is compressed and deformed to a further extent. In other words, the bias rubber 62 biases the actuator body 4 toward the stage 11 and applies the compressive force in advance to the actuator body 4 in the direction of the bending vibration in cooperation with the pressurizing rubbers 64.

In the same manner as described in Embodiment 1, the compressive force in the direction of the longitudinal vibration is also applied in advance to the actuator body 4 by the support rubbers 61.

That is, the support rubbers 61, the bias rubber 62 and the pressurizing rubbers 64 function as the pressurizing elements.

The position of the bias rubber 62 corresponds to the lengthwise center of the actuator body 4, while the positions of the pressurizing rubbers 64 are shifted toward the ends of the actuator body 4 from the lengthwise center of the actuator body 4 by the same distance, respectively. With this configuration, the compressive forces applied to the actuator body 4 in the direction of the bending vibration are exerted in line symmetry with respect to the lengthwise center of the actuator body 4 in the lengthwise direction. To keep the longitudinal and bending vibrations in symmetry, it is preferable to apply the compressive forces symmetrically in the thickness direction of the actuator body 4.

The larger the compressive force applied in advance to the actuator body 4 by the bias rubber 62 and the pressurizing rubbers 64 is, the more effectively the reliability improves. However, a too-large compressive force hinders the bending vibration. Therefore, the compressive force is preferably about one to ten times larger than the pressing force exerted on the stage 11 by the actuator body 4. For example, in the case of a several millimeter (mm) long ultrasonic actuator, the pressing force is generally about 0.1 to 10 N. Therefore, the total force applied as the compressive force to the actuator body 4 is about 0.1 to 100 N. The pressing force generally increases as the volume of the actuator body 4 increases.

Though not shown, according to Embodiment 2, five external electrodes to be in electrical conduction with the first electrodes 42a and 42b, the second electrodes 43a and 43b and the common electrode layer 44, respectively, are provided on the side surfaces of the actuator body 4 and five on-case electrodes are formed in parts of the case 205 corresponding to the five external electrodes. Just like the support rubbers 61 and the bias rubber 62, the pressurizing rubbers 64 are made of conductive rubber prepared by alternately stacking insulating layers 6a and conductive layers 6b. The five external electrodes of the actuator body 4 and the five on-case electrodes of the case 205 are brought into electrical conduction, respectively, by the support rubbers 61, the bias rubber 62 and the pressurizing rubbers 64. The five on-case electrodes are electrically connected to five terminal electrodes formed on the outer surfaces of the case 205. Thus, voltage application to the first electrodes 42a and 42b, the second electrodes 43a and 43b and the common electrode layer 44 of the actuator body 4 is achieved by feeding the terminal electrodes.

The support rubbers 61, the bias rubber 62 and the pressurizing rubbers 64 are arranged such that their stacking directions are orthogonal to the plane including the directions of the longitudinal and bending vibrations of the actuator body 4. Therefore, even if the compressibilities of the support rubbers 61, the bias rubber 62 and the pressurizing rubbers 64 vary as the actuator body 4 vibrates, each of the conductive layers 6b absorbs the change in compressibility, i.e., the change in conductivity. As a result, the phenomenon in which the compressibility decreases entirely in one conductive layer 6b and heat is generated is prevented.

According to Embodiment 2, the support rubbers 61, the bias rubber 62 and the pressurizing rubbers 64 apply the compressive forces to the antinodes of the vibrations of the actuator body 4 in advance. Therefore, the strain caused by the tensile stress due to the vibrations of the actuator body 4 is less likely to exceed the elastic limit of the actuator body 4 or the piezoelectric layers 41, and the breakage of the actuator body 4 is prevented. As a result, the reliability of the ultrasonic actuator 202 is improved.

The actuator body 4 is supported relative to the case 205 by the elastic bodies, i.e., the support rubbers 61, the bias rubber 62 and the pressurizing rubbers 64. Therefore, the actuator body 4 is supported without hindering vibration. This improves the efficiency of the ultrasonic actuator 202.

Further, the support rubbers 61, the bias rubber 62 and the pressurizing rubbers 64 are made of conductive rubber and the external electrodes of the actuator body 4 and the electrodes of the case 205 are brought into electrical conduction through the support rubbers 61. Therefore, the possibility of breakage of the actuator body 4 caused by stress concentration on the soldered parts of the actuator body 4 is eliminated.

In the ultrasonic actuator in which the support rubbers 61, the bias rubber 62 and the pressurizing rubbers 64 apply the compressive forces in advance to the actuator body 4 and the electrical conduction between the actuator body 4 and the case 205 is realized by the support rubbers 61, the bias rubber 62 and the pressurizing rubbers 64, the support rubbers 61, the bias rubber 62 and the pressurizing rubbers 64 are arranged such that their stacking directions are orthogonal to the plane including the directions of the longitudinal and bending vibrations of the actuator body 4. Therefore, even if the compressibilities of the support rubbers 61, the bias rubber 62 and the pressurizing rubbers 64 vary as the actuator body 4 vibrates, the alteration of the support rubbers 61, the bias rubber 62 and the pressurizing rubbers 64 is prevented and the occurrence of conduction failure between the actuator body 4 and the case 205 is prevented. Thus, the electrical conduction between the actuator body 4 and the case 205 is ensured.

Other than the above, the ultrasonic actuator of Embodiment 2 offers the same effect as that explained in Embodiment 1.

The bias rubber 62 located at the lengthwise center of the actuator body 4 may be arranged at the antinode of the bending vibration of the actuator body 4 just like the pressurizing rubbers 64.

As an additional effect, Embodiment 2 makes it possible to stabilize the operation of the ultrasonic actuator 202.

To be more specific, the ultrasonic actuator 202 allows the actuator body 4 to generate the longitudinal and bending vibrations in harmony such that the driver elements 7 make an elliptical motion. The characteristic of the ultrasonic actuator 202 is greatly changed depending on the relationship between the resonance frequency of the longitudinal vibration and that of the bending vibration. When the difference between the resonance frequencies of the bending and longitudinal vibrations is greatly shifted from the designed value, the characteristic of the ultrasonic actuator 202 is greatly changed.

In the case where the ultrasonic actuator 202 is pressed toward the stage 11 as described in the present embodiment, the direction of the vibration, especially that of the bending vibration, is the same as the direction in which the ultrasonic actuator 2 is pressed toward the stage 11. Therefore, reaction force actually exerted on the ultrasonic actuator 2 in response to the pressing force is transmitted to the actuator body 4 through the driver elements 7 and the resonance frequency is likely to vary. Even if the externally applied pressing force to the ultrasonic actuator 202 is kept constant, the position of the stage 11 varies or the state of contact between each of the driver elements 7 and the stage 11 varies when the stage 11 is driven by the ultrasonic actuator 202. Therefore, the pressing force actually applied to the ultrasonic actuator 202 varies, i.e., the reaction force exerted on the actuator body 4 varies, and the resonance frequency of the bending vibration varies. As a result, the relationship between the resonance frequencies of the longitudinal and bending vibrations varies. For this reason, the characteristic of the ultrasonic actuator 202 is unstable.

With the foregoing in mind, the ultrasonic actuator 202 of the present embodiment is configured such that the compressive forces are applied in advance especially to the antinodes of the bending vibration. As the compressive forces are applied in advance to the actuator body 4 in this manner, the change in reaction force applied by the stage 11 has smaller effect on the resonance frequency of the bending vibration of the actuator body 4 as compared with the case where no compressive force is applied in advance. Therefore, the ultrasonic actuator 202 is provided with stable characteristic. For this reason, the total force applied in advance as the compression force to the actuator body 4 is preferably larger than the pressing force of the ultrasonic actuator 202. In this manner, the effect of the reaction force applied to the actuator body 4 on the resonance frequency of the actuator body 4 is relatively reduced.

Other Embodiments

Other than the configurations described in Embodiments 1 and 2, the present invention may be configured as follows.

According to the above-described embodiments, the support rubbers 61, the bias rubber 62 and the pressurizing rubbers 64 are arranged such that their stacking directions are orthogonal to the plane including the directions of the longitudinal and bending vibrations of the actuator body 4. However, the present invention is not limited thereto. Specifically, the support rubbers 61, the bias rubber 62 and the pressurizing rubbers 64 are arranged in any way as long as their stacking directions are not parallel to the plane including the directions of the longitudinal and bending vibrations of the actuator body 4. In other words, they are arranged such that their stacking directions intersect with the plane including the directions of the longitudinal and bending vibrations of the actuator body 4. When the support rubbers 61, the bias rubber 62 and the pressurizing rubbers 64 are arranged such that their stacking directions intersect with the plane including the directions of the longitudinal and bending vibrations of the actuator body 4, the dimension of the end faces of the conductive layers 6b (contact surfaces) in the direction along which the compressibilities of the support rubbers 61, the bias rubber 62 and the pressurizing rubbers 64 vary as the actuator body 4 vibrates, becomes larger than that in the case where the support rubbers 61, the bias rubber 62 and the pressurizing rubbers 64 are arranged such that their stacking directions are parallel to the plane including the directions of the longitudinal and bending vibrations of the actuator body 4. As a result, each of the conductive layers 6b is likely to absorb the change in compressibility, i.e., the change in conductivity. Thus, the alteration of the support rubbers 61, the bias rubber 62 and the pressurizing rubbers 64 is restrained. However, it is preferable to arrange the support rubbers 61, the bias rubber 62 and the pressurizing rubbers 64 such that their stacking directions are orthogonal to the directions of the longitudinal and bending vibrations of the actuator body 4 as described in the above-described embodiments. This is because the lengthwise direction of the end faces of the conductive layers 6b corresponds to the direction along which the compressibilities of the support rubbers 61, the bias rubber 62 and the pressurizing rubbers 64 as the actuator body 4 vibrates, and each of the conductive layers 6b is more likely to absorb the change in compressibility or conductivity.

According to the embodiments, the compressive forces are applied to the actuator body 4 only at the antinodes of the vibrations. However, some of the elastic bodies may support larger areas of the actuator body including the antinodes to apply the compressive force.

The ultrasonic actuator 2 is configured such that the actuator body 4 vibrates in the first mode of longitudinal vibration in the lengthwise direction and the second mode of bending vibration in harmony. However, the present invention is not limited thereto. The ultrasonic actuator 2 may generate other kinds of vibrations and other modes. The ultrasonic actuator 2 may be configured in any way as long as it functions as a vibration actuator in which the actuator body 4 vibrates to deliver the driving force caused by the friction between the driver elements 7 and the stage 11.

Figure 14:
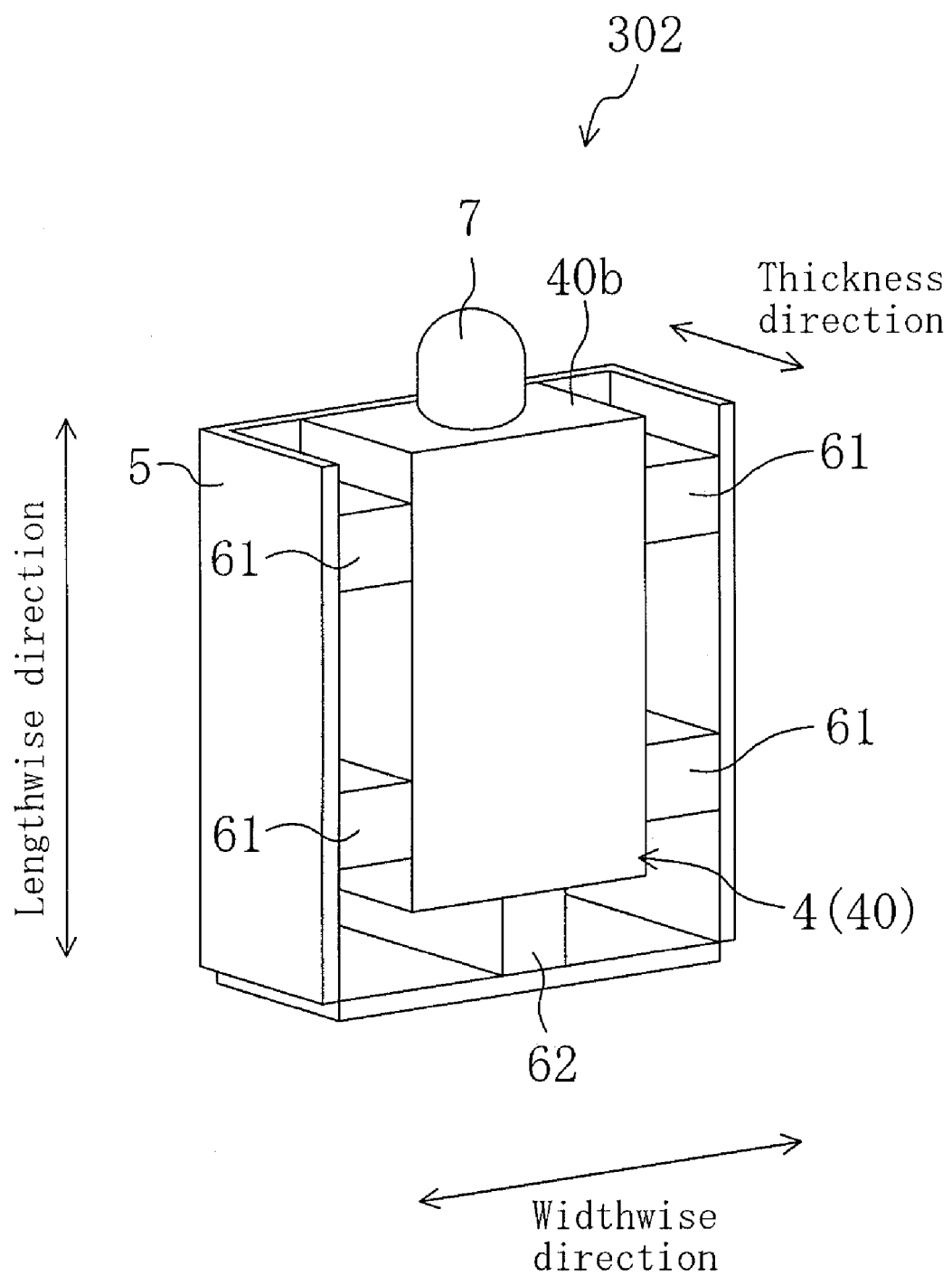
FIG. 14 is a perspective view of another embodiment of the ultrasonic actuator.

It is also possible to adopt an ultrasonic actuator 302 as shown in FIG. 14 in which a single driver element 7 is provided on one short side surface 40b (corresponding to the mount surface) of the piezoelectric element unit 40. With this configuration, the driver element 7 makes a circular motion as the piezoelectric element unit 40 generates the composite vibration of the first mode of longitudinal vibration in the lengthwise direction and the second mode of bending vibration such that the stage 11 moves in the predetermined moving direction (parallel to the widthwise direction) via the friction between the driver element 7 and the stage 11.

Further, in place of the piezoelectric element unit 40 which functions as the actuator body 4, a structure prepared by adhering a piezoelectric element on a metal substrate or a resonator made of metal with a piezoelectric element sandwiched between may be used. In such a case, the resonator including the piezoelectric element functions as the actuator body.

Figure 15:
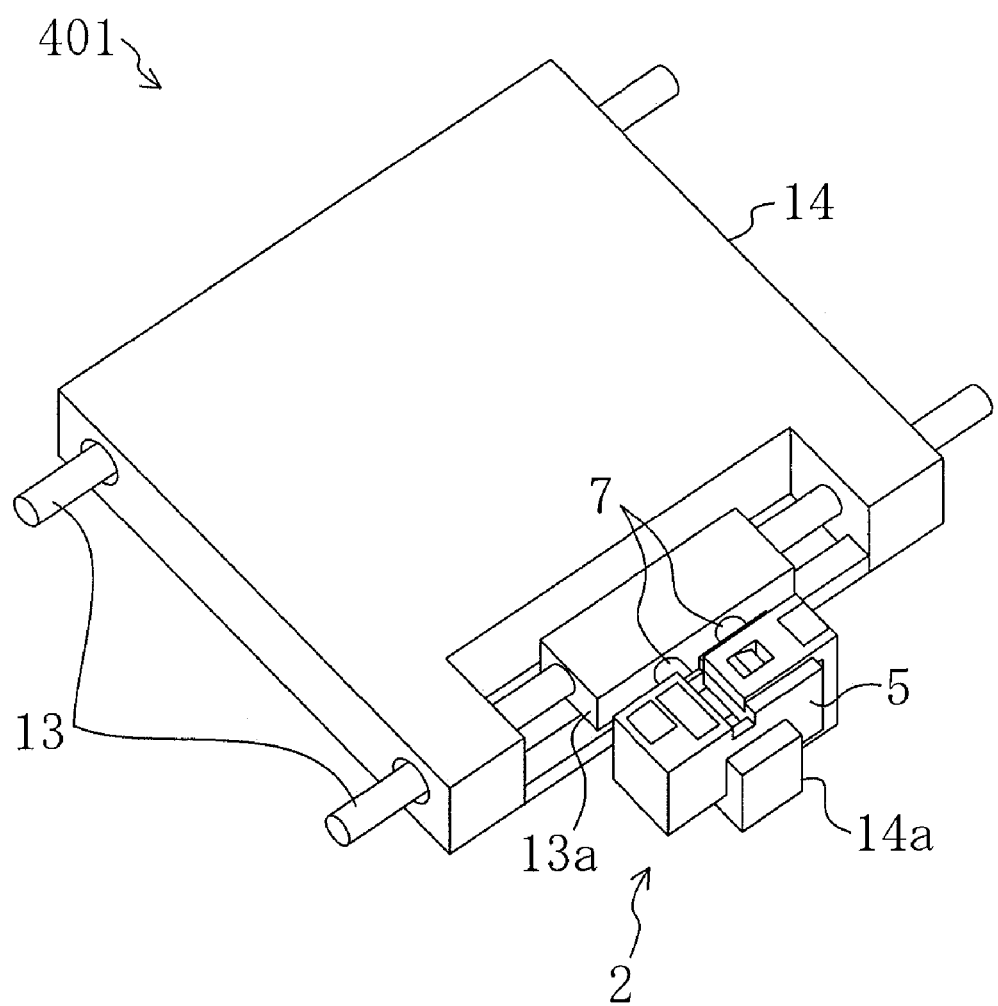
FIG. 15 is a perspective view of another embodiment of the drive unit.

In the above-described embodiments, the ultrasonic actuator 2 is fixed to the base and the driver elements 7 are brought into contact with the movable stage 11. In this state, the ultrasonic actuator 2 is operated to drive the stage 11. However, as shown in FIG. 15, the ultrasonic actuator 2 may be fixed to the stage. Specifically, a drive unit 401 includes guides 13 fixed in parallel with each other on a base, a stage 14 slidably attached to the guides 13 and an ultrasonic actuator 2. One of the guides 13 is provided with an abutment 13a fixed to the guide 13. The stage 14 is provided with an actuator mount 14a. A case 5 is mounted on the actuator mount 14a of the stage 14 such that driver elements 7 of the ultrasonic actuator 2 are in contact with the abutment 13a of the guide 13. When the ultrasonic actuator 2 is operated in this state, the driver elements 7 deliver the driving force to the abutment 13a. Then, the ultrasonic actuator 2 vibrates relatively to the abutment 13a in the lengthwise direction of the guides 13 because the abutment 13a is fixed. As a result, the stage 14 joined with the case 5 via the actuator mount 14a is driven in the lengthwise direction of the guides 13. The abutment 13a receives the driving force generated by the ultrasonic actuator 2 and functions as a relative movable body which is movable relative to the ultrasonic actuator 2.

Figure 16:
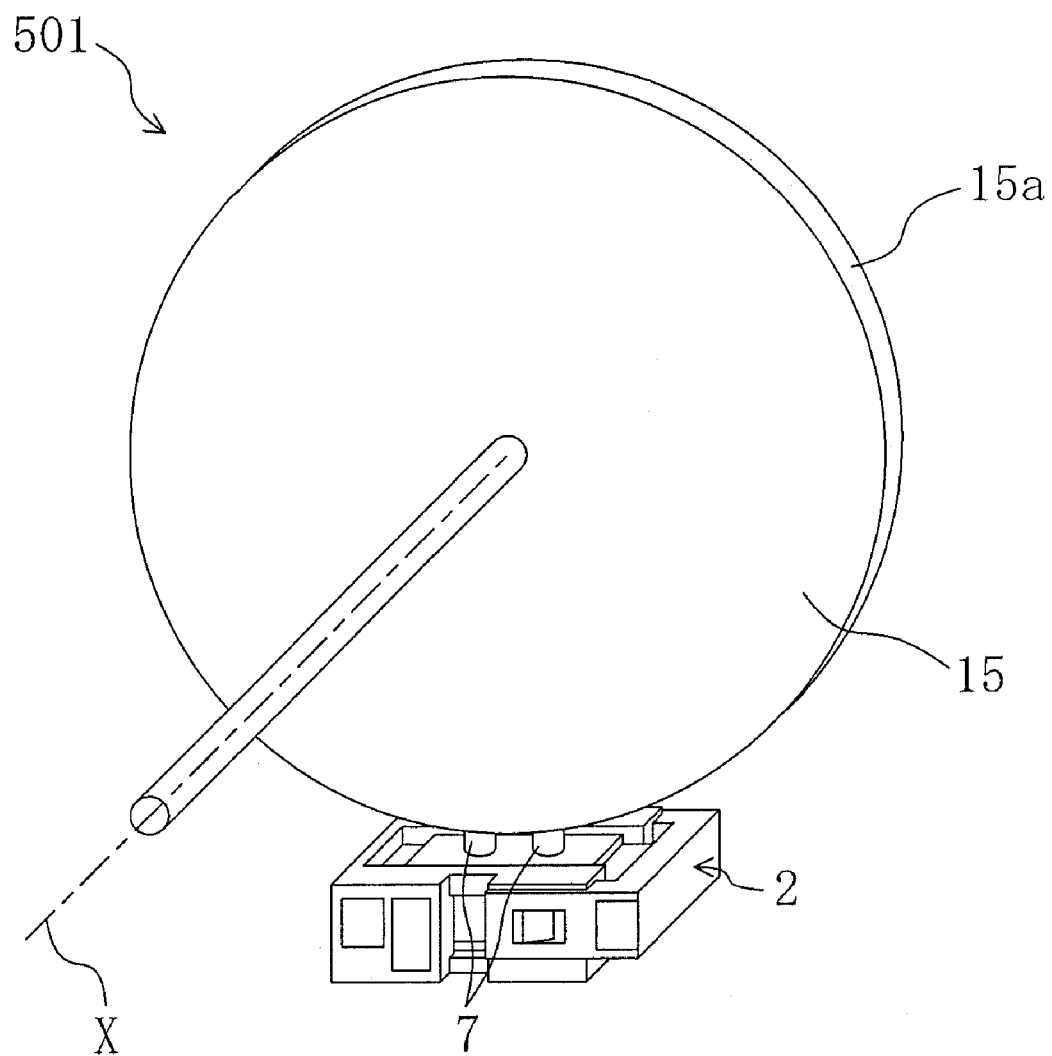
FIG. 16 is a perspective view of still another embodiment of the drive unit.
Figure 17:
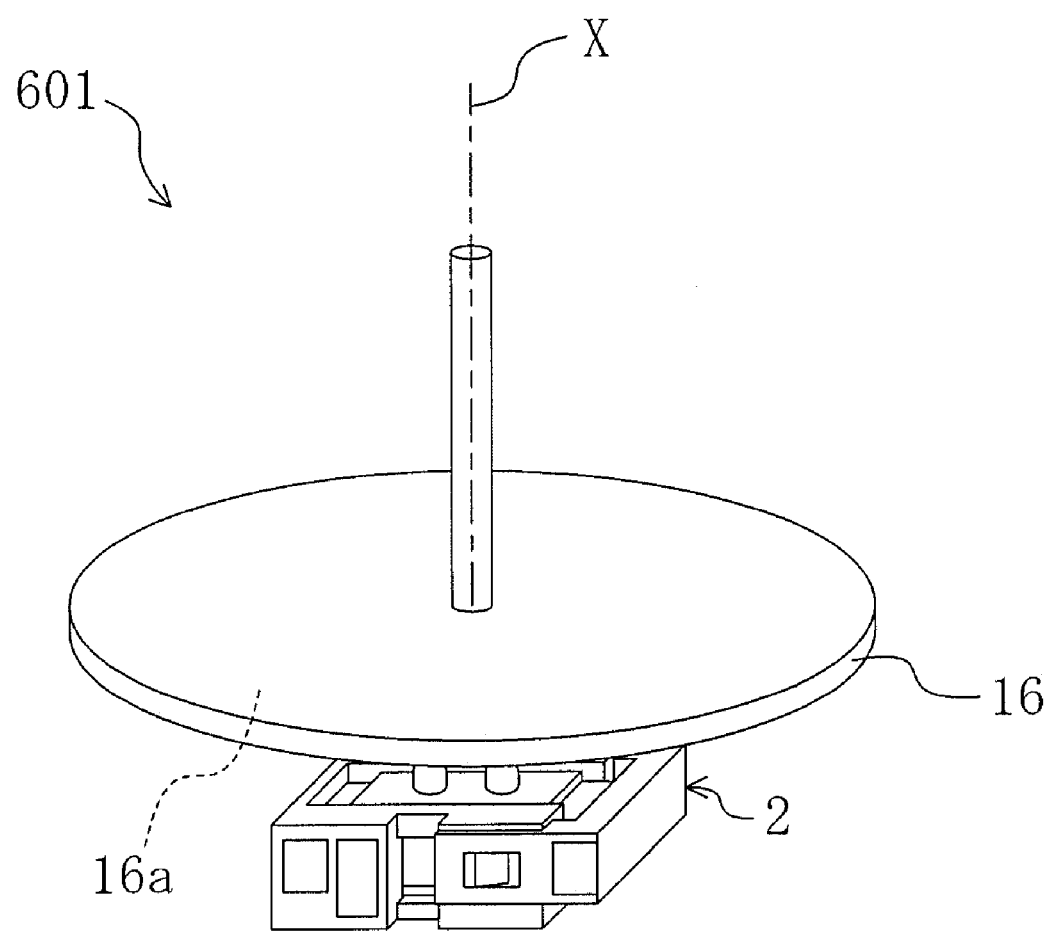
FIG. 17 is a perspective view of still another embodiment of the drive unit.

According to the embodiments described above, the stage 11, which is the target to be driven by the driving force applied thereto by the ultrasonic actuator, is in the form of a flat plate. However, the shape of the movable body is not limited thereto and may be selected as required. For example, as shown in FIG. 16, a disc 15 rotatable about an axis X may be adopted as the movable body in combination with a drive unit 501 configured such that the driver elements 7 of the ultrasonic actuator come into contact with the circumferential face 15a of the disc 15. When the ultrasonic actuator is driven in this configuration, the driver elements 7 make a substantially elliptical motion and the disc 15 rotates about the axis X. Or alternatively, as shown in FIG. 17, a disc 16 rotatable about the axis X may be adopted as the movable body in combination with a drive unit 601 configured such that the driver elements 7 of the ultrasonic actuator come into contact with a flat surface 16a of the disc 16. When the ultrasonic actuator is driven in this configuration, the driver elements 7 make a substantially elliptical motion and the disc 16 is driven in the direction of a tangent at the contact point between the disc 16 and the driver elements 7. As a result, the disc 16 rotates about the axis X.

It should be noted that the present invention is not limited to the above embodiment and various modifications are possible within the spirit and essential features of the present invention. The above embodiment shall be interpreted as illustrative and not in a limiting sense. The scope of the present invention is specified only by the following claims and the description of the specification is not limitative at all. Further, it is also to be understood that all the changes and modifications made within the scope of the claims fall within the scope of the present invention.

As described above, the present invention is useful for a vibration actuator having a piezoelectric element and a drive unit including the vibration actuator.

What is claimed is:

1. A vibration actuator comprising:
   an actuator body having a piezoelectric element and an on-actuator body feeding electrode for applying a voltage to the piezoelectric element, the actuator body delivering a driving force by generating a plurality of vibrations in different directions;
   a base containing the actuator body and having an on-base feeding electrode for feeding the actuator body; and
   a pressurizing element made of conductive rubber including stacked insulators and conductors and arranged between the base and the actuator body such that the pressurizing element brings the on-actuator body feeding electrode and the on-base feeding electrode into conduction and applies in advance a compressive force in the direction of at least one of the vibrations to the actuator body at a non-node part of the at least one of the vibrations of the actuator body,
   wherein the pressurizing element is arranged such that the stacking direction of the conductive rubber intersects with a plane including the directions of the plurality of vibrations of the actuator body.

2. The vibration actuator of claim 1, wherein the pressurizing element is arranged such that the stacking direction of the conductive rubber is orthogonal to the directions of the plurality of vibrations of the actuator body.

3. The vibration actuator of claim 1, wherein the pressurizing element is arranged at part of the actuator body corresponding to an antinode of the at least one of the vibrations of the actuator body.

4. The vibration actuator of claim 1, wherein the pressurizing element is configured to apply the compressive force to the actuator body from both sides of the actuator body sandwiching the center of the actuator body.

5. The vibration actuator of claim 1, wherein the actuator body generates the second mode of bending vibration and the first mode of longitudinal vibration.

6. The vibration actuator of claim 1, wherein the actuator body generates a first vibration and a second vibration in different directions and the compressive force applied by the pressurizing element makes a resonance frequency of the first vibration and a resonance frequency of the second vibration equal.

7. The vibration actuator of claim 1, wherein the actuator body generates a first vibration and a second vibration in different directions and the compressive force applied by the pressurizing element makes a resonance frequency of the second vibration higher than a resonance frequency of the first vibration.

8. A drive unit comprising:
   the vibration actuator of claim 1;
   a relative movable body which is movable relative to the vibration actuator; and
   a biasing element which biases the vibration actuator toward the relative movable body.

9. The drive unit of claim 8, wherein the biasing element is made of conductive rubber including stacked insulators and conductors and the stacking direction of the conductive rubber intersects with a plane including the directions of the plurality of vibrations of the actuator body.

10. The drive unit of claim 9, wherein the biasing element is arranged such that the stacking direction of the conductive rubber is orthogonal to the directions of the plurality of vibrations of the actuator body.

* * * * *